US012794437B2

(12) United States Patent
Dong et al.

(10) Patent No.: US 12,794,437 B2
(45) Date of Patent: Nov. 10, 2026

(54) ACOUSTIC WAVE RESONATOR AND DEVICE FOR WIRELESS COMMUNICATIONS

(71) Applicant: HUAWEI TECHNOLOGIES CO., LTD., Shenzhen (CN)

(72) Inventors: Shurong Dong, Hangzhou (CN); Zhihong Feng, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 712 days.

(21) Appl. No.: 17/975,954

(22) Filed: Oct. 28, 2022

(65) Prior Publication Data

US 2023/0067985 A1 Mar. 2, 2023

Related U.S. Application Data

(63) Continuation of application No. PCT/CN2021/089635, filed on Apr. 25, 2021.

(30) Foreign Application Priority Data

Apr. 29, 2020 (CN) ......................... 202010357143.3

(51) Int. Cl.
*H03H 9/02* (2006.01)
*H03H 9/17* (2006.01)
*H03H 9/54* (2006.01)

(52) U.S. Cl.
CPC ........ *H03H 9/02015* (2013.01); *H03H 9/171* (2013.01); *H03H 9/54* (2013.01)

(58) Field of Classification Search
CPC ...... H03H 9/02015; H03H 9/171; H03H 9/54; H03H 9/02157; H03H 9/132
See application file for complete search history.

(56) References Cited

U.S. PATENT DOCUMENTS

2006/0071736 A1 4/2006 Ruby et al.
2009/0267453 A1 10/2009 Barber et al.
(Continued)

FOREIGN PATENT DOCUMENTS

CN 1801614 A 7/2006
CN 1845453 A 10/2006
(Continued)

OTHER PUBLICATIONS

Enlund et al:"Solidly mounted thin film electro-acoustic resonator utilizing a conductive Bragg reflector" Sensors and Actuators A: Physical,Elsevier,vol. 141 No. 2 Feb. 2, 2008 (Feb. 2, 2008) pp. 598 602 XP022452406,total:5pages.
(Continued)

*Primary Examiner* — Matthew C Landau
*Assistant Examiner* — Halee Cramer

(57) ABSTRACT

An acoustic wave resonator for use in a device for wireless communications includes a first electrode, a second electrode, and a piezoelectric layer disposed between the first electrode and the second electrode. The first electrode has a first region made of a material having a first density, and a second region formed as a loop region surrounding the first region and electrically connected to the first region. The second region is made of a material having a second density that is different from the first density.

13 Claims, 10 Drawing Sheets

(56) References Cited

U.S. PATENT DOCUMENTS

| | | | | |
|---|---|---|---|---|
| 2014/0118088 | A1* | 5/2014 | Burak | H03H 9/02118 333/187 |
| 2014/0354115 | A1* | 12/2014 | Burak | H03H 9/175 310/348 |
| 2016/0142041 | A1* | 5/2016 | Kuwahara | H03H 9/1085 333/195 |
| 2016/0308509 | A1* | 10/2016 | Burak | H03H 9/132 |
| 2017/0054430 | A1 | 2/2017 | Fattinger et al. | |
| 2017/0263844 | A1* | 9/2017 | Tajic | H03H 9/131 |
| 2017/0264267 | A1 | 9/2017 | Tajic et al. | |
| 2018/0175826 | A1 | 6/2018 | Sadhu et al. | |
| 2019/0190483 | A1 | 6/2019 | Ivira et al. | |
| 2020/0228089 | A1* | 7/2020 | Tajic | H03H 9/02062 |
| 2020/0412331 | A1 | 12/2020 | Cheng et al. | |

FOREIGN PATENT DOCUMENTS

| | | | |
|---|---|---|---|
| CN | 103780219 | A | 5/2014 |
| CN | 107592091 | A | 1/2018 |
| CN | 111010117 | A | 4/2020 |
| CN | 110324022 | B | 4/2023 |
| DE | 102017109102 | A1 | 1/2018 |
| EP | 4016842 | A1 | 6/2022 |

OTHER PUBLICATIONS

Li Xinyi et al:"Use of double-raised-border structure for quality factor enhancement of typell piston mode FBAR" Joint Conference of the European Frequency and T Me Forum and EEE Nternational Frequency Control Symposium, Jul. 9, 2017 (Jul. 9, 2017) pp. 547-550,XP033242034 Total:4pages.

* cited by examiner

ACOUSTIC WAVE RESONATOR AND DEVICE FOR WIRELESS COMMUNICATIONS

CROSS-REFERENCE TO RELATED APPLICATION

This application is a continuation of International Application PCT/CN2021/089635, filed on Apr. 25, 2021, which claims priority to Chinese Patent Application No. 202010357143.3, filed on Apr. 29, 2020. The disclosures of the aforementioned priority applications are hereby incorporated by reference in their entirety.

TECHNICAL FIELD

This application relates to the field of wireless communications, and more specifically to an acoustic wave resonator, a filter, and a device used in the field of wireless communications.

BACKGROUND

Film bulk acoustic resonator (FBAR) filters have become mainstream radio frequency devices in the field of wireless communications. An FBAR has a high Q value. Therefore, a filter that is composed of the FBAR has excellent roll-off features and out-of-band suppression, and a low in-band insertion loss.

As shown in FIG. 1, the FBAR includes a piezoelectric film sandwiched between an upper metal electrode and a lower metal electrode to form a sandwich structure. An alternating radio frequency voltage is applied between the two electrodes to form an alternating electric field in the piezoelectric film. At a specific frequency, a longitudinal acoustic wave propagating along a z-axis is excited to form a standing wave oscillation.

Most acoustic waves in the FBAR resonator propagate vertically (along the z-axis), but various boundary conditions lead to transverse (horizontal) acoustic wave propagation, which may create a transverse standing wave. The transverse standing wave causes in-band ripples, which reduces the Q value. With developments of communications technologies, the working frequency of a FBAR increases, the thickness (specifically, a thickness in a z-axis direction) of the FBAR becomes thinner, the size of a device with an improved integration level is reduced, and a ratio of a thickness to a width of the device is increased. Consequently, the impact of a transverse vibration characteristic of a piezoelectric layer becomes more significant. How to suppress the transverse standing wave is a key technology to improving the filtering feature of the FBAR filter.

As the working frequency of the FBAR increases, the thickness of the device becomes thinner. As the integration level improves, a transverse size of the device needs to be reduced. As the ratio of thickness to width increases, the impact of the transverse vibration characteristic of piezoelectric layer is more significant. In particular, when two sides of the electrodes of the FBAR are parallel to each other, a lateral mode generated on one side is reflected by the other side and superimposed on each other. If transverse modes are superimposed and amplified, a transverse mode with a small amplitude also affects the transverse vibration characteristic. As a result, the performance of the device is adversely affected. An irregular electrode shape is commonly used to reduce influence of the transverse standing wave, but this design does not have an obvious suppression effect on a high frequency parasitic wave.

SUMMARY

This application provides an acoustic wave resonator, a filter, a receiver, a transmitter, and a wireless communications device, to suppress a transverse standing wave and improve a suppression effect on a high frequency parasitic wave.

According to a first aspect, an acoustic wave resonator is provided, including: a first electrode made of a conductive material; a second electrode made of the conductive material; and a piezoelectric layer made of a piezoelectric material and disposed between the first electrode and the second electrode. The first electrode includes: a first region, where a material of the first region has a first density; and a second region, where the second region is formed as a loop region surrounding the first region and electrically connected (that is, electric connected) to the first region. A material of the second region has a second density, and the second density is different from the first density.

According to the acoustic wave resonator provided in this application, the first electrode includes the first region located in a central position and the second region surrounding the first region, both the first region and the second region are made of conductive materials, and the density of the second region is different from the density of the first region. Therefore, a boundary condition can be formed, a parasitic mode can be suppressed, a power capacity can be increased, and an effective area, structural stability, and the like of the device are not affected.

In this application, the first electrode is in a sheet shape or a plate shape.

In addition, the first electrode and the second electrode are disposed in parallel.

As an example but not a limitation, the material of the first region may include but is not limited to molybdenum, titanium, platinum, aluminum, copper, gold, or the like.

In addition, the material of the second region may include but is not limited to molybdenum, titanium, platinum, aluminum, copper, gold, or the like.

It should be understood that the foregoing listed materials of the first region and the second region are merely examples for description, and this application is not limited thereto. For example, the material of the first region or the second region may alternatively be a material such as an alloy.

Optionally, a height of the first region is the same as a height of the second region in a first direction, and the first direction is perpendicular to a configuration plane of the first electrode.

Alternatively, the height of the first region is different from the height of the second region in the first direction.

For example, the height of the first region in the first direction may be greater than the height of the second region in the first direction.

It should be understood that the foregoing listed relationships between the heights of the first region and the second region in the first direction are merely examples for description, and this is not particularly limited in this application. For example, the height of the first region in the first direction may also be less than the height of the second region.

Optionally, a width d2 between an outer edge and an inner edge of the second region is greater than or equal to 0.5 micrometers and less than or equal to 10 micrometers.

Therefore, filtering requirements of signals of different frequencies can be flexibly met.

In this application, the term "outer edge" may be understood as an outer ring edge of a loop region (or a projection of the loop region on a configuration plane), and the term "inner edge" may be understood as an inner ring edge of a loop region (or a projection of the loop region on a configuration plane). To avoid repetition, description of a same or similar case is omitted.

Optionally, the material of the first region has a first heat conductivity, the material of the second region has a second heat conductivity, and the first heat conductivity is greater than the second heat conductivity.

Because a central region of the electrode generates a large amount of heat, a thermal conductivity of the material of the first region at the center is greater than a thermal conductivity of the material of the second region at the edge. Therefore, this can facilitate heat dissipation of the acoustic wave resonator and further improve performance of the acoustic wave resonator in this application.

Optionally, in the first region and the second region, a height of a region with a higher density in the first direction is greater than a height of a region with a lower density in the first direction.

In this way, an effect of a boundary condition between the first region and the second region can be significantly improved, a parasitic mode can be further suppressed, and performance of the acoustic wave resonator in this application can be improved.

Optionally, a height difference between the first region and the second region in the first direction is greater than or equal to 5 nanometers and less than or equal to 100 nanometers, and the first direction is perpendicular to the configuration plane of the first electrode.

Therefore, on a basis that a boundary condition is formed between the first region and the second region, filtering of signals of different frequency ranges can be flexibly handled.

Optionally, in the first density and the second density, a larger density is three times as large as a smaller density, or a larger density is seven times as large as a smaller density.

By increasing a density difference between the first region and the second region, the effect of the boundary condition between the first region and the second region can be significantly improved, the parasitic mode can be further suppressed, and the performance of the acoustic wave resonator in this application can be improved.

Optionally, the material of the first region is tungsten, and the material of the second region is aluminum; or the material of the first region is aluminum, and the material of the second region is tungsten.

By selecting the foregoing materials, the density difference between the first region and the second region can be easily increased, so that practicability of the acoustic wave resonator in this application can be further improved.

Optionally, when the second density is less than the first density, the first electrode further includes a third region, where the third region is formed as a loop region surrounding the second region and electrically connected to the second region. A material of the third region has a third density, and the second density is less than the third density.

A density of the third region is different from the density of the second region, so that the boundary condition can be formed between the second region and the third region, and the parasitic mode can be further suppressed.

As an example but not a limitation, the material of the third region may include but is not limited to tungsten, molybdenum, titanium, platinum, aluminum, copper, gold, or the like.

It should be understood that the foregoing listed materials of the third region are merely examples for description, and this application is not limited thereto. For example, the material of the third region may alternatively be a material such as an alloy.

Optionally, heights of the first region, the second region, and the third region are the same in a first direction, and the first direction is perpendicular to the configuration plane of the first electrode.

Alternatively, heights of the first region, the second region, and the third region are different in the first direction. For example, a height of the third region in the first direction may be greater than the height of the first region in the first direction, and the height of the first region in the first direction may be greater than the height of the second region in the first direction.

By making a height of a high-density region greater than a height of a low-density region, the effect of the boundary condition can be further improved, and the parasitic mode can be further suppressed.

Optionally, a width d3 between an outer edge and an inner edge of the third region is greater than or equal to 0.5 micrometers and less than or equal to 10 micrometers.

Optionally, the first density is less than the third density.

Optionally, the material of the third region has a third heat conductivity, and the first heat conductivity is greater than the third heat conductivity.

Optionally, the first electrode further includes a fourth region, where the fourth region is formed as a loop region surrounding the third region and electrically connected to the third region. A material of the fourth region has a fourth density, and the third density is less than the fourth density.

A density of the fourth region is different from the density of the third region, so that the boundary condition can be formed between the fourth region and the third region, and the parasitic mode can be further suppressed.

As an example but not a limitation, the material of the fourth region may include but is not limited to tungsten, molybdenum, titanium, platinum, aluminum, copper, gold, or the like.

It should be understood that the foregoing listed materials of the fourth region are merely examples for description, and this application is not limited thereto. For example, the material of the fourth region may alternatively be a material such as an alloy.

Optionally, heights of the first region, the second region, the third region, and the fourth region are the same in the first direction, and the first direction is perpendicular to the configuration plane of the first electrode.

Alternatively, heights of the first region, the second region, the third region, and the fourth region are different in the first direction. For example, the height of the fourth region in the first direction may be greater than the height of the first region in the first direction, and the height of the first region in the first direction may be greater than the height of the second region in the first direction. In addition, for another example, the height of the third region in the first direction may be greater than the height of the first region in the first direction. For example, the height of the third region may be the same as the height of the first region in the first direction.

By making a height of a high-density region greater than a height of a low-density region, the effect of the boundary condition can be further improved, and the parasitic mode can be further suppressed.

Optionally, a width d3 between an outer edge and an inner edge of the third region is greater than or equal to 0.1 micrometers and less than or equal to 2 micrometers. A width d4 between an outer edge and an inner edge of the fourth region is greater than or equal to 0.5 micrometers and less than or equal to 10 micrometers.

Therefore, on a basis that the boundary condition between the first region and the second region is improved, filtering of signals of different frequency ranges can be flexibly handled.

Optionally, the first density is the same as the third density.

For example, materials of the first region and the third region may be the same.

Optionally, the material of the fourth region has a fourth heat conductivity, and the first heat conductivity is greater than the fourth heat conductivity.

Optionally, the acoustic wave resonator further includes: a substrate, where a lower electrode is disposed on the substrate, and the lower electrode is one of the first electrode or the second electrode; and an acoustic isolation layer, where the acoustic isolation layer is located between the lower electrode and the substrate. A projection of a top electrode on the configuration plane of the first electrode is located inside a projection of the acoustic isolation layer on the configuration plane of the first electrode, and the top electrode is the other one of the first electrode or the second electrode.

In a second aspect, a filter is provided, including an acoustic wave resonator, where the acoustic wave resonator includes: a first electrode made of a conductive material; a second electrode made of the conductive material; and a piezoelectric layer made of a piezoelectric material and disposed between the first electrode and the second electrode. The first electrode includes: a first region, where a material of the first region has a first density; and a second region, where the second region is formed as a loop region surrounding the first region and electrically connected to the first region. A material of the second region has a second density, and the second density is different from the first density.

According to the acoustic wave resonator provided in this application, the first electrode includes the first region located in a central position and the second region surrounding the first region, both the first region and the second region are made of conductive materials, and the density of the second region is different from the density of the first region. Therefore, a boundary condition can be formed, a parasitic mode can be suppressed, a power capacity can be increased, and an effective area, structural stability, and the like of the device are not affected.

In this application, the first electrode is in a sheet shape or a plate shape.

In addition, the first electrode and the second electrode are disposed in parallel.

As an example but not a limitation, the material of the first region may include but is not limited to molybdenum, titanium, platinum, aluminum, copper, gold, or the like.

In addition, the material of the second region may include but is not limited to molybdenum, titanium, platinum, aluminum, copper, gold, or the like.

It should be understood that the foregoing listed materials of the first region and the second region are merely examples for description, and this application is not limited thereto. For example, the material of the first region or the second region may alternatively be a material such as an alloy.

Optionally, a height of the first region is the same as a height of the second region in a first direction, and the first direction is perpendicular to a configuration plane of the first electrode.

Alternatively, the height of the first region is different from the height of the second region in the first direction.

For example, the height of the first region in the first direction may be greater than the height of the second region in the first direction.

It should be understood that the foregoing listed relationships between the heights of the first region and the second region in the first direction are merely examples for description, and this is not particularly limited in this application. For example, the height of the first region in the first direction may also be less than the height of the second region.

Optionally, a width d2 between an outer edge and an inner edge of the second region is greater than or equal to 0.5 micrometers and less than or equal to 10 micrometers.

In this application, the term "outer edge" may be understood as an outer ring edge of a loop region (or a projection of the loop region on a configuration plane), and the term "inner edge" may be understood as an inner ring edge of a loop region (or a projection of the loop region on a configuration plane). To avoid repetition, description of a same or similar case is omitted.

Optionally, the material of the first region has a first heat conductivity, the material of the second region has a second heat conductivity, and the first heat conductivity is greater than the second heat conductivity.

Optionally, in the first region and the second region, a height of a region with a higher density in the first direction is greater than a height of a region with a lower density in the first direction.

Optionally, a height difference between the first region and the second region in the first direction is greater than or equal to 5 nanometers and less than or equal to 100 nanometers, and the first direction is perpendicular to the configuration plane of the first electrode.

Optionally, in the first density and the second density, a larger density is three times as large as a smaller density, or a larger density is seven times as large as a smaller density.

Optionally, the material of the first region is tungsten, and the material of the second region is aluminum; or the material of the first region is aluminum, and the material of the second region is tungsten.

Optionally, when the second density is less than the first density, the first electrode further includes a third region, where the third region is formed as a loop region surrounding the second region and electrically connected to the second region. A material of the third region has a third density, and the second density is less than the third density.

As an example but not a limitation, the material of the third region may include but is not limited to tungsten, molybdenum, titanium, platinum, aluminum, copper, gold, or the like.

It should be understood that the foregoing listed materials of the third region are merely examples for description, and this application is not limited thereto. For example, the material of the third region may alternatively be a material such as an alloy.

Optionally, heights of the first region, the second region, and the third region are the same in a first direction, and the first direction is perpendicular to the configuration plane of the first electrode.

Alternatively, heights of the first region, the second region, and the third region are different in the first direction. For example, a height of the third region in the first direction may be greater than the height of the first region in the first direction, and the height of the first region in the first direction may be greater than the height of the second region in the first direction.

Optionally, a width d3 between an outer edge and an inner edge of the third region is greater than or equal to 0.5 micrometers and less than or equal to 10 micrometers.

Optionally, the first density is less than the third density.

Optionally, the material of the third region has a third heat conductivity, and the first heat conductivity is greater than the third heat conductivity.

Optionally, the first electrode further includes a fourth region, where the fourth region is formed as a loop region surrounding the third region and electrically connected to the third region. A material of the fourth region has a fourth density, and the third density is less than the fourth density.

As an example but not a limitation, the material of the fourth region may include but is not limited to tungsten, molybdenum, titanium, platinum, aluminum, copper, gold, or the like.

It should be understood that the foregoing listed materials of the fourth region are merely examples for description, and this application is not limited thereto. For example, the material of the fourth region may alternatively be a material such as an alloy.

Optionally, heights of the first region, the second region, the third region, and the fourth region are the same in the first direction, and the first direction is perpendicular to the configuration plane of the first electrode.

Alternatively, heights of the first region, the second region, the third region, and the fourth region are different in the first direction. For example, the height of the fourth region in the first direction may be greater than the height of the first region in the first direction, and the height of the first region in the first direction may be greater than the height of the second region in the first direction. In addition, for another example, the height of the third region in the first direction may be greater than the height of the first region in the first direction. For example, the height of the third region may be the same as the height of the first region in the first direction.

Optionally, a width d3 between an outer edge and an inner edge of the third region is greater than or equal to 0.1 micrometers and less than or equal to 2 micrometers. A width d4 between an outer edge and an inner edge of the fourth region is greater than or equal to 0.5 micrometers and less than or equal to 10 micrometers.

Optionally, the first density is the same as the third density.

For example, materials of the first region and the third region may be the same.

Optionally, the material of the fourth region has a fourth heat conductivity, and the first heat conductivity is greater than the fourth heat conductivity.

Optionally, the acoustic wave resonator further includes: a substrate, where a lower electrode is disposed on the substrate, and the lower electrode is one of the first electrode or the second electrode; and an acoustic isolation layer, where the acoustic isolation layer is located between the lower electrode and the substrate. A projection of a top electrode on the configuration plane of the first electrode is located inside a projection of the acoustic isolation layer on the configuration plane of the first electrode, and the top electrode is the other one of the first electrode or the second electrode.

According to a third aspect, a wireless communications device is provided, including a receiver and/or a transmitter, where at least one of the receiver and the transmitter includes the filter according to any one of the second aspect or the possible implementation of the second aspect.

According to a fourth aspect, a terminal device is provided, including: a transceiver, configured to receive a downlink signal or send an uplink signal, where the transceiver includes the filter according to any one of the second aspect or the possible implementation of the second aspect, the filter is configured to filter a to-be-sent uplink signal before the uplink signal is sent, or the filter is configured to filter the received downlink signal after the downlink signal is received; and a processor, where the processor is configured to perform signal processing on the signal, for example, perform coding and modulation on to-be-sent data to generate the uplink signal, or demodulate or decode the received downlink signal.

According to a fifth aspect, a base station is provided, including: a transceiver, configured to receive an uplink signal or send a downlink signal, where the transceiver includes the filter according to any one of the second aspect or the possible implementation of the second aspect, the filter is configured to filter a to-be-sent downlink signal before the downlink signal is sent, or the filter is configured to filter the received uplink signal after the uplink signal is received; and a processor, configured to perform signal processing on the signal, for example, perform coding and modulation on to-be-sent data to generate the downlink signal, or demodulate or decode the received uplink signal.

DESCRIPTION OF EMBODIMENTS

The following describes the technical solutions of this application with reference to the accompanying drawings.

Figure 1:
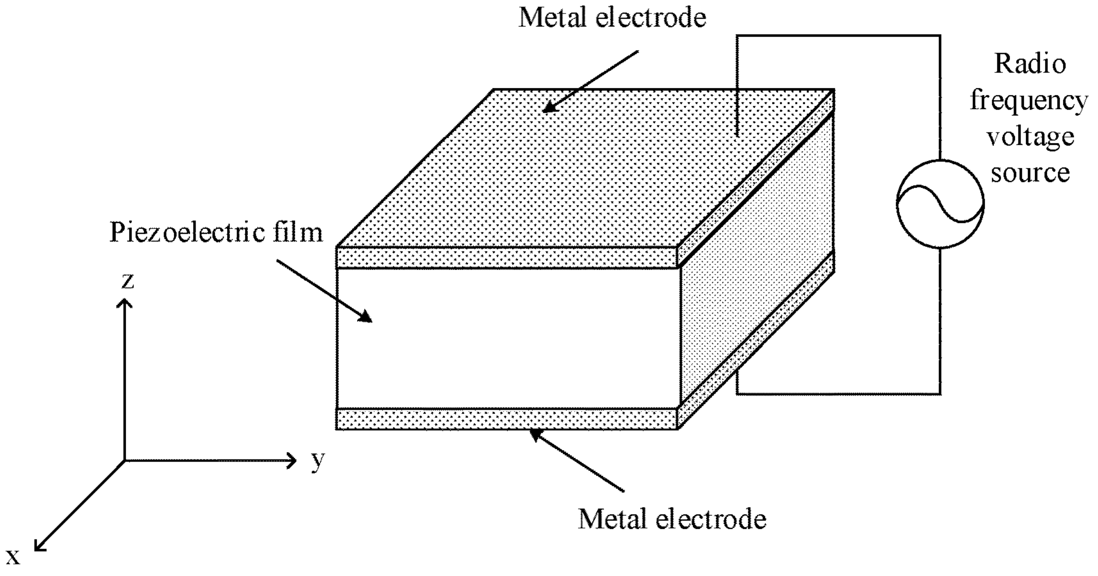
FIG. 1 is a schematic diagram of a structure of an acoustic wave resonator.
Figure 2:
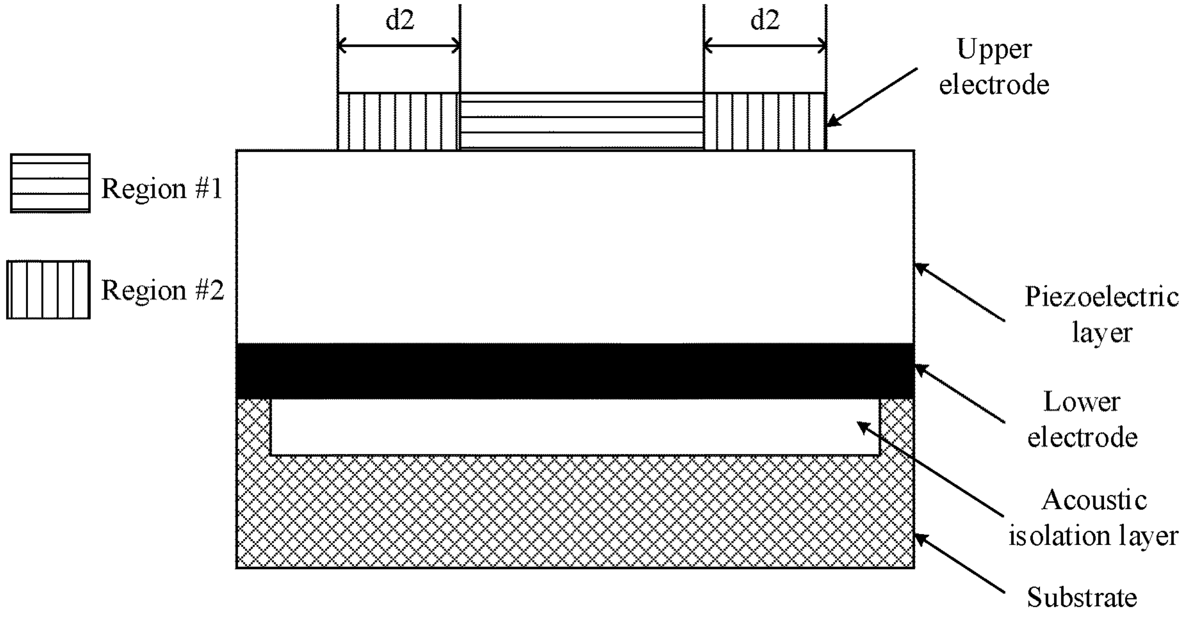
FIG. 2 is a front sectional view of an example of an acoustic wave resonator according to this application.

FIG. 2 is a schematic diagram of a structure of an example of an acoustic wave resonator according to this application.

As shown in FIG. 2, the acoustic wave resonator (or a film bulk acoustic wave resonator) includes:

a substrate;

a lower electrode (namely, an example of a second electrode), disposed above the substrate;

a piezoelectric layer, disposed above a lower electrode; and an upper electrode (namely, an example of a first electrode), disposed above the piezoelectric layer.

It should be understood that the foregoing listed structures of the acoustic wave resonator are merely rational description, and are not specifically limited in this application.

For example, an acoustic isolation layer (or an acoustic isolator) may be formed between the lower electrode and the substrate.

The following separately describes the foregoing parts in detail.

A. Substrate

As an example but not a limitation, the substrate may be formed as a cuboid or a cube.

The lower electrode in this application is disposed on an upper surface of the substrate.

In the following, for ease of understanding and description, a plane formed by an x-axis direction and a y-axis direction of a three-dimensional coordinate system is denoted as a plane #A (namely, an example of a configuration plane). In this case, the upper surface of the substrate is parallel or approximately parallel to the plane #A.

The substrate may be a semiconductor material, for example, silicon.

It should be noted that, based on a configuration requirement, the acoustic wave resonator in this application may not include the substrate.

B. Acoustic Isolation Layer

The acoustic isolation layer may be located inside the substrate, and is configured to reflect an acoustic wave.

For example, as shown in FIG. 2, the acoustic isolation layer may be an air cavity formed in the substrate.

Alternatively, the acoustic isolation layer may be an acoustic reflector.

It should be noted that, based on a configuration requirement, the acoustic wave resonator in this application may not include the acoustic isolation layer.

C. Lower Electrode

As shown in FIG. 2, the lower electrode is located above the acoustic isolation layer (specifically, above a z-axis direction of the three-dimensional coordinate system).

In other words, the lower electrode is disposed on the upper surface of the substrate.

As an example but not a limitation, as shown in FIG. 2, a boundary (or an edge) of the lower electrode is located outside a boundary of the acoustic isolation layer. In other words, a projection of the acoustic isolation layer on the plane #A is located inside a projection of the lower electrode on the plane #A.

In this application, the lower electrode may be made of a conductive material.

As an example but not a limitation, the lower electrode material may include but is not limited to molybdenum, titanium, platinum, aluminum, copper, gold, and the like.

In this application, the lower electrode may be in a sheet shape or a plate shape extending in a direction of the plane #A.

As an example but not a limitation, a shape of the lower electrode (specifically, a shape of a projection of the lower electrode in the direction of the plane #A) may include but is not limited to a polygon such as a square, a rectangle, or an irregular geometric. This is not particularly limited in this application.

D. Piezoelectric Layer (or a Film Piezoelectric Layer)

As shown in FIG. 2, the piezoelectric layer is located above the lower electrode (specifically, above the z-axis direction of the three-dimensional coordinate system).

In this application, the top electrode may be formed as a film extending in the direction of the plane #A.

In this application, the piezoelectric layer can generate a piezoelectric effect or an inverse piezoelectric effect.

The piezoelectric effect means that when some dielectrics are deformed by an external force in a specific direction, polarization occurs inside the dielectrics, and positive and negative charges appear on two opposite surfaces of the dielectrics. When the external force is removed, the dielectrics will return to an uncharged state. This phenomenon is called a positive piezoelectric effect. When a direction of the force changes, a polarity of a charge also changes. On the contrary, when an electric field is applied to a polarization direction of the dielectrics, the dielectrics also deform. After the electric field is removed, deformation of the dielectrics disappears. This phenomenon is called the inverse piezoelectric effect.

A principle of the piezoelectric effect is as follows. If pressure is applied to a piezoelectric material, a potential difference (referred to as the positive piezoelectric effect) is generated. If a voltage is applied to a piezoelectric material, mechanical stress (referred to as the inverse piezoelectric effect) is generated. If the pressure is a high-frequency vibration, a high-frequency current is generated. When high-frequency electrical signals are added to piezoelectric ceramics, high-frequency acoustic signals (mechanical vibration) are generated.

As an example but not a limitation, a material of the piezoelectric layer may include but is not limited to aluminum nitride (AlN), aluminum scandium nitride (AlScN), lead zirconate titanate (PZT), lithium niobate ($LiNbO_3$), or the like.

E. Upper Electrode

As shown in FIG. 2, the upper electrode is located above the piezoelectric layer (specifically, above the z-axis direction of the three-dimensional coordinate system).

As an example but not a limitation, as shown in FIG. 2, a boundary (or an edge) of the upper electrode is located inside the boundary of the acoustic isolation layer. In other words, a projection of the upper electrode on the plane #A is located inside the projection of the acoustic isolation layer on the plane #A.

In this application, the top electrode may be made of a conductive material.

In this application, the upper electrode may be in a sheet shape or a plate shape extending in the direction of the plane #A.

As an example but not a limitation, a shape of the upper electrode (specifically, a shape of a projection of the lower electrode in the direction of the plane #A) may include but is not limited to a polygon (for example, an irregular polygon) or an irregular geometric shape. This is not particularly limited in this application. For example, as shown in FIG. 3, the upper electrode may be a trapezoid.

Figure 3:
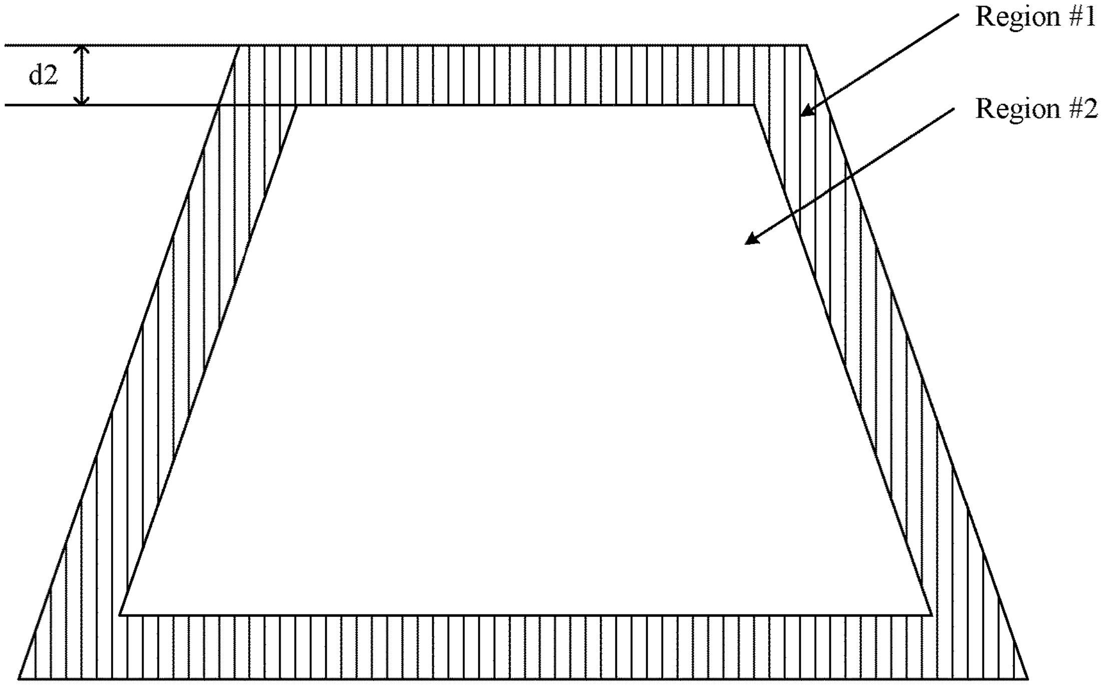
FIG. 3 is a top view of an upper electrode of the acoustic wave resonator in FIG. 2.

As shown in FIG. 2 or FIG. 3, in this application, the top electrode may include a region #1 (namely, an example of a first region) and a region #2 (namely, an example of a second region).

The region #2 is formed as a loop region surrounding the region #1.

In addition, the region #2 is electrically connected to the region #1. For example, the region #2 that is electrically connected to the region #1 may be generated around the region #1 in a manner such as vapor deposition.

As an example but not a limitation, a boundary (or an edge) of the region #1 is located inside the boundary of the acoustic isolation layer. In other words, a projection of the region #1 on the plane #A is located inside the projection of the acoustic isolation layer on the plane #A.

In addition, a height (specifically, a height in the z-axis direction) of the region #1 is greater than or equal to 0.05 micrometers (μm) and less than or equal to 0.6 μm.

The region #1 is made of a conductive material. For example, a material of the region #1 is molybdenum, titanium, platinum, aluminum, copper, gold, or the like.

It should be understood that the foregoing listed materials of the region #1 are merely examples for description, and this application is not limited thereto.

The following describes parameters in the region #2 in detail.

1. Size of Region #2

A boundary of the region #2 may be located on an inner side of the boundary of the acoustic isolation layer. In other words, a projection of the region #2 on the plane #A is located inside the projection of the acoustic isolation layer on the plane #A.

2. Width of Region #2

As an example but not a limitation, a width d2 of an edge of an outer ring and an edge of an inner ring of the region #2 (or a loop width of a projection of the region #2 on the plane #A, or a thickness of the region #2) is greater than or equal to 0.5 μm and less than or equal to 10 μm.

It should be understood that the foregoing enumerated values of the width d2 of the region #2 are merely examples for description. This is not particularly limited in this application. A value of the width d2 of the region #2 may be randomly adjusted based on parameters such as a range of the region #1 and a range of the acoustic isolation layer.

3. Height of Region #2

A height of the region #2 (specifically, a height in the z-axis direction) may be greater than or equal to 0.05 micrometers (μm), and may be less than or equal to 0.6 μm.

For example, as shown in FIG. 2, the height of the region #2 may be the same as the height of the region #1.

Figure 4:
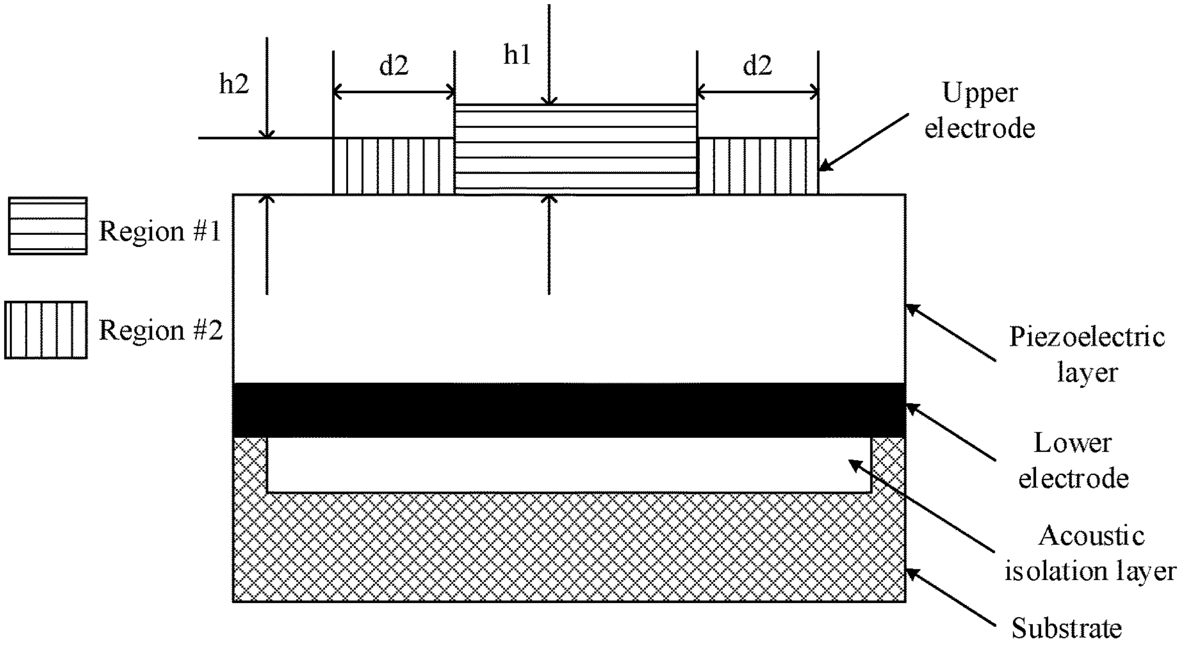
FIG. 4 is a front sectional view of another example of an acoustic wave resonator according to this application.

Alternatively, a height h2 of the region #2 may be different from a height h1 of the region #1. For example, in the region #1 and the region #2, a height of a region with a higher density is greater than a height of a region with a lower density. For example, as shown in FIG. 4, if a density ρ1 of the region #1 is greater than a density ρ2 of the region #2, h1 is greater than h2.

4. Material of Region #2

The region #2 is made of a conductive material. For example, a material of the region #2 is molybdenum, titanium, platinum, aluminum, copper, gold, or the like.

It should be understood that the foregoing listed materials of the region #2 are merely examples for description, and this application is not limited thereto.

5. Density of the Region #2 (Specifically, a Relationship Between a Density of the Region #2 and a Density of the Region #1)

In this application, the density ρ2 of the region #2 is different from the density ρ1 of the region #1. Therefore, an acoustic reflection boundary condition is formed, and a transverse parasitic mode is suppressed.

For example, in this application, the density of the region #2 may be less than the density of the region #1 by selecting a material.

For another example, in this application, the density of the region #2 may be greater than the density of the region #1 by selecting a material.

As an example but not a limitation, for example, ρ1 may be three times or more than three times as large as ρ2 by selecting a material.

For another example, ρ2 may be three times or more than three times as large as ρ1 by selecting a material.

As an example but not a limitation, for example, ρ1 may be seven times or more than seven times as large as ρ2 by selecting a material. For example, the material of the region #1 is tungsten, and the material of the region #2 is aluminum.

For another example, ρ2 may be three times or more than three times as large as ρ1 by selecting a material. For example, the material of the region #1 is aluminum, and the material of the region #2 is molybdenum.

6. Thermal Conductivity of Region #2 (Specifically, a Relationship Between a Thermal Conductivity of the Region #2 and a Thermal Conductivity of the Region #1)

In this application, a thermal conductivity k2 of the region #2 is less than a thermal conductivity k1 of the region #1.

Specifically, an FBAR uses the piezoelectric effect to generate resonance of a radio frequency band. Compared with a conventional dielectric device, the FBAR has dielectric loss, and also has electromechanical loss caused by mechanical vibration of a piezoelectric body. Therefore, obvious temperature rise or thermal stress occurs when the FBAR works, and the temperature rise or the thermal stress inevitably causes a performance drift of the FBAR. When the performance drift exceeds a design specification, the device cannot be used. This is why a power capacity of the FBAR is low. Because of mechanical resonance, a resonance amplitude is the largest in the middle of a resonance region because the most heat is generated at an electrode due to load. Because a suspended structure is the most difficult part of heat dissipation, a heat problem of the device is the most obvious in the suspended structure region, and adverse impact is the most serious. This is a key position that restricts a maximum power capacity of the device.

According to the solution provided in this application, the heat conductivity k2 of the region #2 is enabled to be less than the heat conductivity k1 of the region #1, so that a heat dissipation effect of the region #1 located in the middle of the resonance region can be improved, so that a power capacity of the FBAR is improved.

For example, in this application, the thermal conductivity k2 of the region #2 may be less than the thermal conductivity k1 of the region #1 by selecting a material.

The following describes a method for preparing the acoustic wave resonator.

(a) A sacrificial layer material is deposited on a silicon substrate, where the sacrificial layer material may be a dielectric material such as silicon dioxide or phosphorosilicate glass. A pattern of the sacrificial layer material is manufactured into a pattern of a predetermined acoustic isolation layer by photoetching and etching processes to form a sacrificial layer of the acoustic isolation layer.

(b) Silicon or germanium is epitaxially extended on a surface of the silicon substrate on which no sacrificial layer material is disposed by using an epitaxial process, an epitaxial height is greater than or equal to a height of the sacrificial layer, and the sacrificial layer and the substrate are processed into a flat surface by using a chemical mechanical polishing process, to facilitate subsequent electrode and piezoelectric layer deposition and patterning processes.

(c) A lower electrode material above the sacrificial layer and the substrate is deposited by using a physical vapor deposition process or another process, where the lower electrode material may be a metal material such as molybdenum, platinum, tungsten, or aluminum, and a lower electrode is formed by using photoetching and etching processes.

(d) A piezoelectric layer is deposited above the lower electrode by using the physical vapor deposition process.

(e) An electrode material of the region #1 is deposited above the piezoelectric layer by using the physical vapor deposition process, and an electrode of the region #1 is formed by using the photoetching and etching processes.

(f) An electrode material of the region #2 is deposited above the piezoelectric layer by using the physical vapor deposition process, and an electrode of the region #2 is formed by using the photoetching and etching processes.

(h) The sacrificial layer material is removed by using a corrosion solution or gas to form an acoustic isolation layer.

Figure 5:
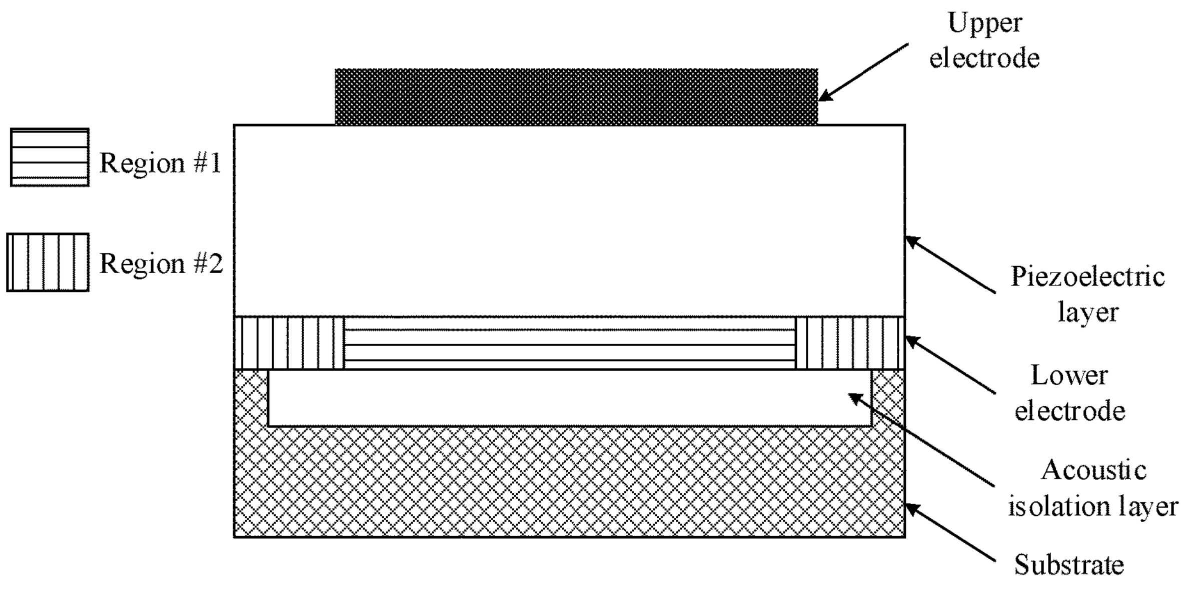
FIG. 5 is a front sectional view of still another example of an acoustic wave resonator according to this application.

FIG. 5 is a front sectional view of still another example of an acoustic wave resonator according to this application. A difference from the acoustic wave resonator shown in FIG. 2 lies in that the lower electrode of the acoustic wave resonator shown in FIG. 5 includes two regions, and parameters of the two regions are similar to parameters of two regions of the upper electrode of the acoustic wave resonator shown in FIG. 2. To avoid repetition, detailed description is omitted herein.

In addition, to improve performance of the piezoelectric layer, in the acoustic wave resonator shown in FIG. 5, heights (specifically, heights in the z-axis direction) of the two regions of the lower electrode are the same, and flatness of upper surfaces (that is, surfaces in contact with the piezoelectric layer) of the two regions of the lower electrode is the same.

Figure 6:
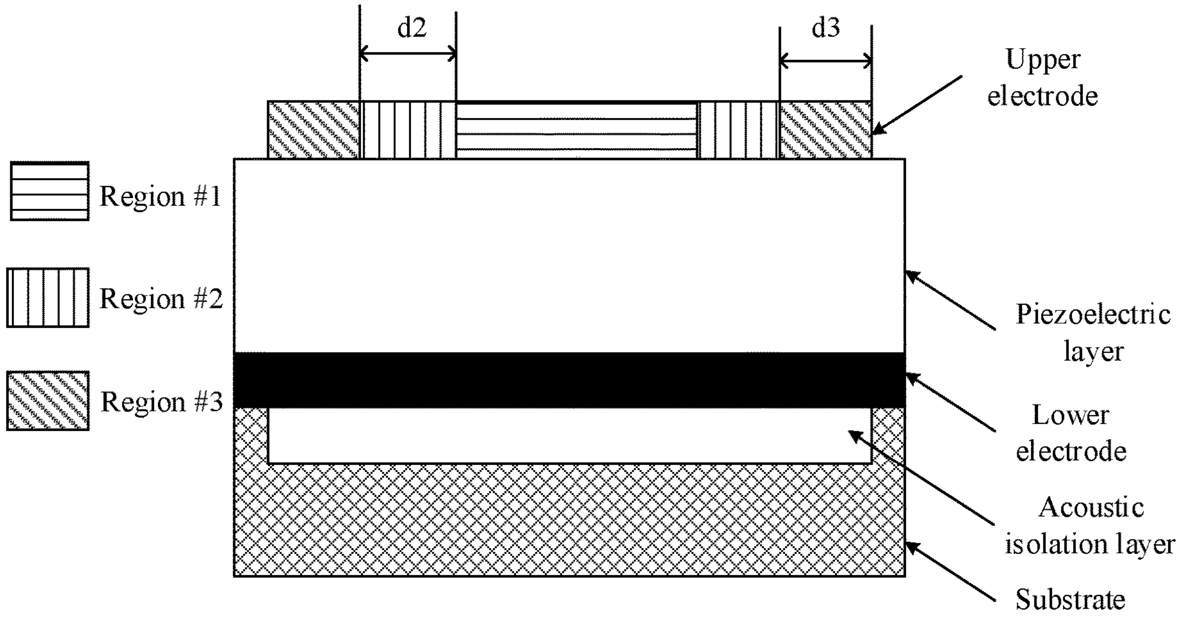
FIG. 6 is a front sectional view of still another example of an acoustic wave resonator according to this application.
Figure 7:
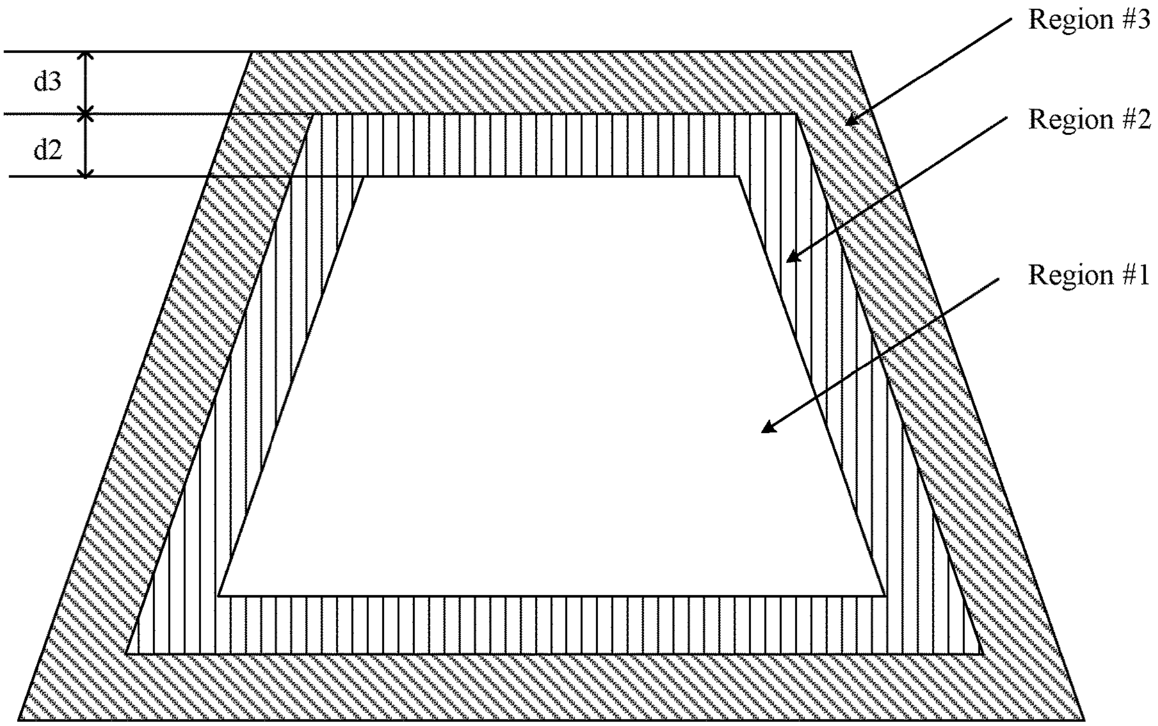
FIG. 7 is a top view of an upper electrode of the acoustic wave resonator in FIG. 6.

FIG. 6 and FIG. 7 show still another example of an acoustic wave resonator according to this application. A difference from the acoustic wave resonator shown in FIG. 2 lies in that the upper electrode of the acoustic wave resonator shown in FIG. 6 and FIG. 7 includes three regions. To avoid repetition, the following mainly describes the three regions of the upper electrode in detail.

As shown in FIG. 6 or FIG. 7, in this application, the top electrode may include the region #1 (namely, an example of the first region), the region #2 (namely, an example of the second region), and a region #3 (namely, an example of a third region).

The region #2 is formed as a loop region surrounding the region #1.

In addition, the region #2 is electrically connected to the region #1. For example, the region #2 that is electrically connected to the region #1 may be generated around the region #1 in a manner such as vapor deposition.

The region #3 forms a loop region surrounding the region #2.

In addition, the region #3 is electrically connected to the region #2. For example, the region #3 that is electrically connected to the region #2 may be generated around the region #2 in a manner such as vapor deposition.

As an example but not a limitation, a boundary (or an edge) of the region #1 is located inside the boundary of the acoustic isolation layer. In other words, a projection of the region #1 on the plane #A is located inside the projection of the acoustic isolation layer on the plane #A.

In addition, a height (specifically, a height in the z-axis direction) of the region #1 is greater than or equal to 0.05 micrometers (μm) and less than or equal to 0.6 μm.

The region #1 is made of a conductive material. For example, the material of the region #1 is molybdenum, titanium, platinum, aluminum, copper, gold, or the like.

It should be understood that the foregoing listed materials of the region #1 are merely examples for description, and this application is not limited thereto.

The following describes parameters in the region #2 in detail.

1. Size of Region #2

A boundary of the region #2 may be located on the inner side of the boundary of the acoustic isolation layer. In other words, a projection of the region #2 on the plane #A is located inside the projection of the acoustic isolation layer on the plane #A.

2. Width of Region #2

As an example but not a limitation, a width d2 of an edge of an outer ring and an edge of an inner ring of the region #2 (or a loop width of a projection of the region #2 on the plane #A, or a thickness of the region #2) is greater than or equal to 0.5 μm and less than or equal to 10 μm.

It should be understood that the foregoing enumerated values of the width d2 of the region #2 are merely examples for description. This is not particularly limited in this application. A value of the width d2 of the region #2 may be randomly adjusted based on parameters such as a range of the region #1 and a range of the acoustic isolation layer.

3. Height of Region #2

A height of the region #2 (specifically, a height in the z-axis direction) may be greater than or equal to 0.05 micrometers (μm), and may be less than or equal to 0.6 μm.

For example, as shown in FIG. 2, the height of the region #2 may be the same as the height of the region #1.

Alternatively, the height h2 of the region #2 may be different from the height h1 of the region #1. For example, as shown in FIG. 4, h1 is greater than h2.

4. Material of Region #2

The region #2 is made of a conductive material. For example, the material of the region #2 is molybdenum, titanium, platinum, aluminum, copper, gold, or the like.

It should be understood that the foregoing listed materials of the region #2 are merely examples for description, and this application is not limited thereto.

5. Density of Region #2 (Specifically, a Relationship Between the Density of the Region #2 and the Density of the Region #1)

In this application, the density $\rho 2$ of the region #2 is less than the density $\rho 1$ of the region #1. Therefore, an acoustic reflection boundary condition is formed, and a transverse parasitic mode is suppressed.

For example, in this application, the density of the region #2 may be less than the density of the region #1 by selecting a material.

6. Thermal Conductivity of Region #2 (Specifically, a Relationship Between a Thermal Conductivity of the Region #2 and a Thermal Conductivity of the Region #1)

In this application, the thermal conductivity k2 of the region #2 is less than the thermal conductivity k1 of the region #1.

For example, in this application, the thermal conductivity k2 of the region #2 may be less than the thermal conductivity k1 of the region #1 by selecting a material.

The following describes parameters in the region #3 in detail.

a. Size of Region #3

A boundary of the region #3 may be located on the inner side of the boundary of the acoustic isolation layer. In other words, a projection of the region #3 on the plane #A is located inside the projection of the acoustic isolation layer on the plane #A.

b. Width of Region #3

As an example but not a limitation, a width d3 of an edge of an outer ring and an edge of an inner ring of the region #3 (or a loop width of a projection of the region #3 on the plane #A, or a thickness of the region #3) is greater than or equal to 0.5 μm and less than or equal to 10 μm.

It should be understood that the foregoing enumerated values of the width d3 of the region #3 are merely examples for description. This is not particularly limited in this application. A value of the width d3 of the region #3 may be randomly adjusted based on parameters such as a range of the region #1, a range of the region #2, and a range of the acoustic isolation layer.

c. Height of Region #3

A height of the region #3 (specifically, a height in the z-axis direction) may be greater than or equal to 0.05 micrometers (μm), and may be less than or equal to 0.6 μm.

For example, as shown in FIG. 6, the height of the region #3 is the same as the height of the region #1 and/or the height of the region #2.

Figure 8:
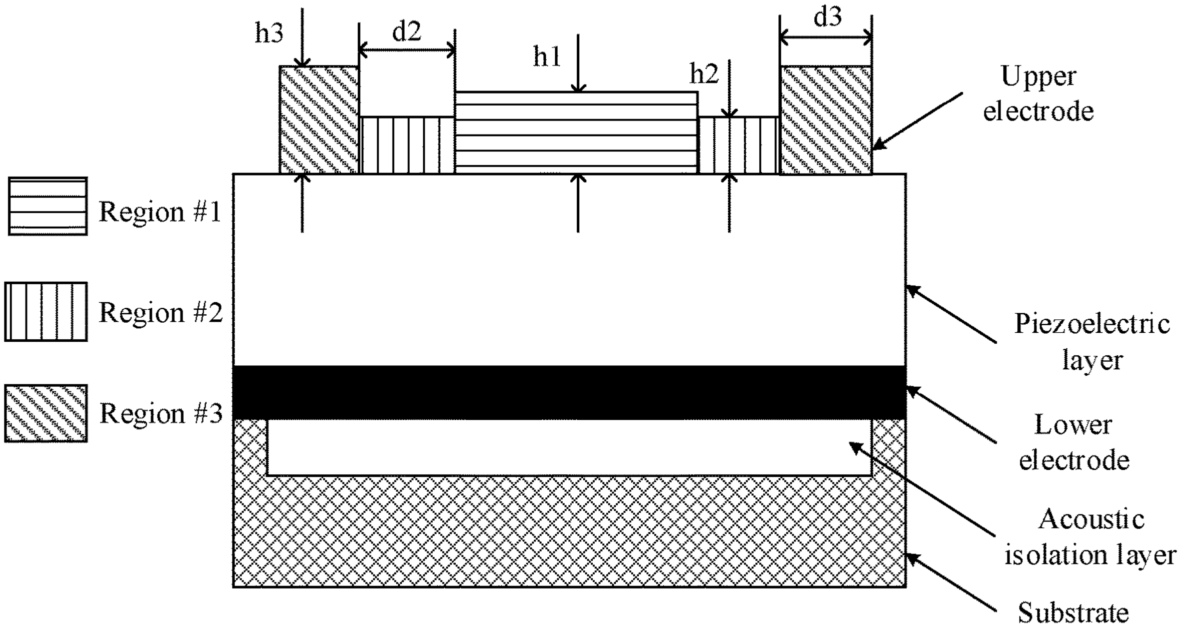
FIG. 8 is a front sectional view of another example of an acoustic wave resonator according to this application.

Alternatively, a height h3 of the region #3 may be different from a height h1 of the region #1. For example, as shown in FIG. 8, h3 is greater than h1. Alternatively, the height h3 of the region #3 may be different from the height h2 of the region #2. For example, as shown in FIG. 8, h3 is greater than h2.

For example, $h1=h2=h3$.

For another example, $h3>h1>h2$.

d. Material of Region #3

The region #3 is made of a conductive material. For example, the material of the region #3 is molybdenum, titanium, platinum, aluminum, copper, gold, or the like.

It should be understood that the foregoing listed materials of the region #3 are merely examples for description, and this application is not limited thereto.

e. Density of Region #3 (Specifically, a Relationship Between a Density of the Region #3 and the Density of the Region #1 and the Density of the Region #2)

In this application, a density $\rho 3$ of the region #3 is greater than the density $\rho 1$ of the region #1, and the density $\rho 3$ of the region #3 is greater than the density $\rho 2$ of the region #2. Therefore, an acoustic reflection boundary condition is formed, and a transverse parasitic mode is suppressed.

For example, $\rho 3>\rho 1>\rho 2$.

In this application, the density of the region #3 may be greater than the density of the region #1 and the density of the region #2 by selecting a material.

f. Thermal Conductivity of Region #3 (Specifically, a Relationship Between the Thermal Conductivity of the Region #3 and a Thermal Conductivity of the Region #1 and/or a Thermal Conductivity of the Region #2)

In this application, a thermal conductivity k3 of the region #3 is less than the thermal conductivity k1 of the region #1.

For example, in this application, the thermal conductivity k3 of the region #3 may be less than the thermal conductivity k1 of the region #1 by selecting a material.

In addition, in this application, a relationship between the thermal conductivity k3 of the region #3 and the thermal conductivity k2 of the region #2 is not particularly limited.

The following describes a method for preparing the acoustic wave resonator.

(a) A sacrificial layer material is deposited on a silicon substrate, where the sacrificial layer material may be a dielectric material such as silicon dioxide or phosphorosilicate glass. A pattern of the sacrificial layer material is manufactured into a pattern of a predetermined acoustic isolation layer by photoetching and etching processes to form a sacrificial layer of the acoustic isolation layer.

(b) Silicon or germanium is epitaxially extended on a surface of the silicon substrate on which no sacrificial layer material is disposed by using an epitaxial process, an epitaxial height is greater than or equal to a height of the sacrificial layer, and the sacrificial layer and the substrate are processed into a flat surface by using a chemical mechanical polishing process, to facilitate subsequent electrode and piezoelectric layer deposition and patterning processes.

(c) A lower electrode material above the sacrificial layer and the substrate is deposited by using a physical vapor deposition process or another process, where the lower electrode material may be a metal material such as molybdenum, platinum, tungsten, or aluminum, and a lower electrode is formed by using photoetching and etching processes.

(d) A piezoelectric layer is deposited above the lower electrode by using the physical vapor deposition process.

(e) An electrode material of the region #1 is deposited above the piezoelectric layer by using the physical vapor deposition process, and an electrode of the region #1 is formed by using the photoetching and etching processes.

(f) An electrode material of the region #2 is deposited above the piezoelectric layer by using the physical vapor deposition process, and an electrode of the region #2 is formed by using the photoetching and etching processes.

(g) An electrode material of the region #3 is deposited above the piezoelectric layer by using the physical vapor deposition process, and an electrode of the region #3 is formed by using the photoetching and etching processes.

(h) The sacrificial layer material is removed by using a corrosion solution or gas to form an acoustic isolation layer.

Figure 9:
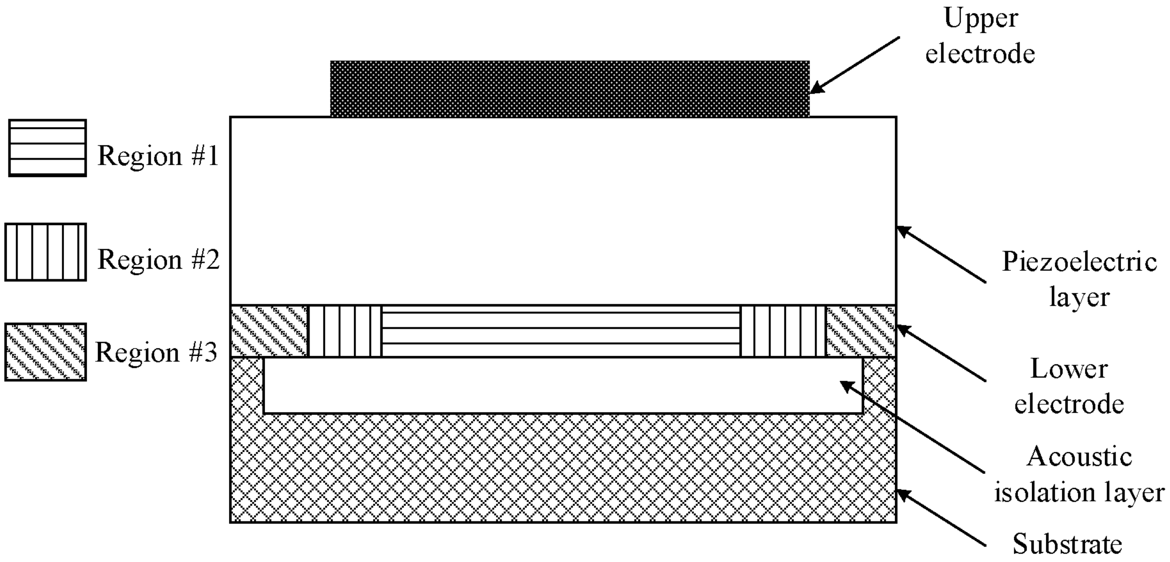
FIG. 9 is a front sectional view of still another example of an acoustic wave resonator according to this application.

FIG. 9 is a front sectional view of still another example of an acoustic wave resonator according to this application. A difference from the acoustic wave resonator shown in FIG. 6 lies in that the lower electrode of the acoustic wave resonator shown in FIG. 9 includes three regions, and parameters of the three regions are similar to parameters of three regions of the upper electrode of the acoustic wave resonator shown in FIG. 6. To avoid repetition, detailed description is omitted herein.

In addition, to improve performance of the piezoelectric layer, in the acoustic wave resonator shown in FIG. 9, heights (specifically, heights in the z-axis direction) of the three regions of the lower electrode are the same, and flatness of upper surfaces (that is, surfaces in contact with the piezoelectric layer) of the three regions of the lower electrode is the same.

Figure 10:
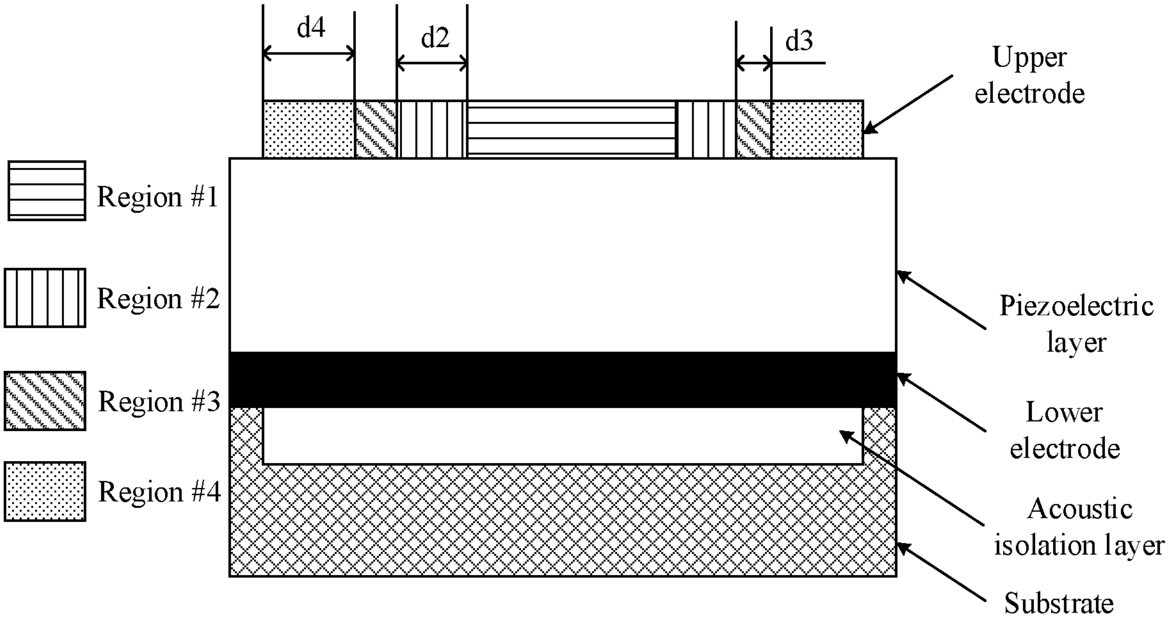
FIG. 10 is a front sectional view of still another example of an acoustic wave resonator according to this application.
Figure 11:
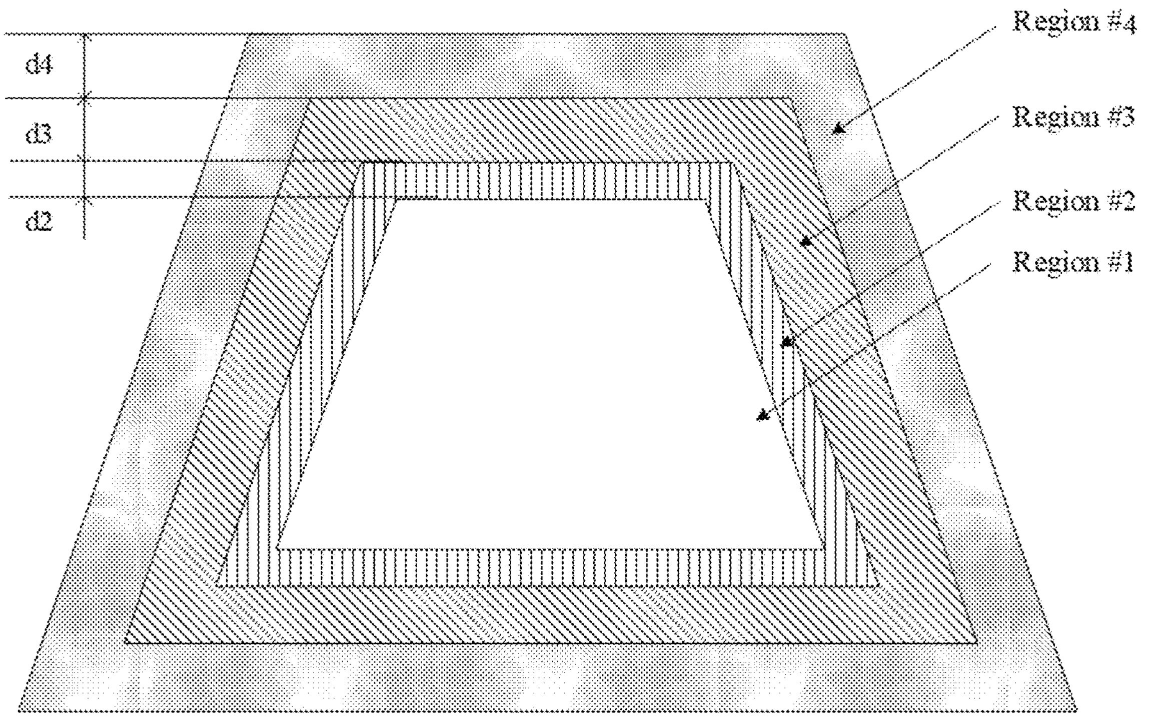
FIG. 11 is a top view of an upper electrode of the acoustic wave resonator in FIG. 10.

FIG. 10 and FIG. 11 show still another example of an acoustic wave resonator according to this application. A difference from the acoustic wave resonator shown in FIG. 2 lies in that the upper electrode of the acoustic wave resonator shown in FIG. 10 and FIG. 11 includes four regions. To avoid repetition, the following mainly describes the four regions of the upper electrode in detail.

As shown in FIG. 10 or FIG. 11, in this application, the top electrode may include the region #1 (namely, an example of the first region), the region #2 (namely, an example of the second region), a region #3 (namely, an example of the third region), and a region #4 (namely, an example of the fourth region).

The region #2 is formed as a loop region surrounding the region #1.

In addition, the region #2 is electrically connected to the region #1. For example, the region #2 that is electrically connected to the region #1 may be generated around the region #1 in a manner such as vapor deposition.

The region #3 forms a loop region surrounding the region #2.

In addition, the region #3 is electrically connected to the region #2. For example, the region #3 that is electrically connected to the region #2 may be generated around the region #2 in a manner such as vapor deposition.

In addition, the region #4 is electrically connected to the region #3. For example, the region #4 that is electrically connected to the region #3 may be generated around the region #3 in a manner such as vapor deposition.

In addition, the region #4 is electrically connected to the region #3. For example, the region #4 that is electrically connected to the region #3 may be generated around the region #3 in a manner such as vapor deposition.

As an example but not a limitation, a boundary (or an edge) of the region #1 is located inside the boundary of the acoustic isolation layer. In other words, a projection of the region #1 on the plane #A is located inside the projection of the acoustic isolation layer on the plane #A.

In addition, a height (specifically, a height in the z-axis direction) of the region #1 is greater than or equal to 0.05 micrometers (μm) and less than or equal to 0.6 μm.

The region #1 is made of a conductive material. For example, the material of the region #1 is molybdenum, titanium, platinum, aluminum, copper, gold, or the like.

It should be understood that the foregoing listed materials of the region #1 are merely examples for description, and this application is not limited thereto.

The following describes parameters in the region #2 in detail.

1. Size of Region #2

A boundary of the region #2 may be located on the inner side of the boundary of the acoustic isolation layer. In other words, a projection of the region #2 on the plane #A is located inside the projection of the acoustic isolation layer on the plane #A.

2. Width of Region #2

As an example but not a limitation, a width d2 of an edge of an outer ring and an edge of an inner ring of the region #2 (or a loop width of a projection of the region #2 on the plane #A, or a thickness of the region #2) is greater than or equal to 0.5 μm and less than or equal to 10 μm.

It should be understood that the foregoing enumerated values of the width d2 of the region #2 are merely examples for description. This is not particularly limited in this application. A value of the width d2 of the region #2 may be randomly adjusted based on parameters such as a range of the region #1 and a range of the acoustic isolation layer.

3. Height of Region #2

A height of the region #2 (specifically, a height in the z-axis direction) may be greater than or equal to 0.05 micrometers (μm), and may be less than or equal to 0.6 μm.

For example, as shown in FIG. 2, the height of the region #2 may be the same as the height of the region #1.

Alternatively, the height h2 of the region #2 may be different from the height h1 of the region #1. For example, as shown in FIG. 4, h1 is greater than h2.

4. Material of Region #2

The region #2 is made of a conductive material. For example, the material of the region #2 is molybdenum, titanium, platinum, aluminum, copper, gold, or the like.

It should be understood that the foregoing listed materials of the region #2 are merely examples for description, and this application is not limited thereto.

5. Density of Region #2 (Specifically, a Relationship Between the Density of the Region #2 and the Density of the Region #1)

In this application, the density ρ2 of the region #2 is less than the density ρ1 of the region #1. Therefore, an acoustic reflection boundary condition is formed, and a transverse parasitic mode is suppressed.

For example, in this application, the density of the region #2 may be less than the density of the region #1 by selecting a material.

6. Thermal Conductivity of Region #2 (Specifically, a Relationship Between the Thermal Conductivity of the Region #2 and the Thermal Conductivity of the Region #1)

In this application, the thermal conductivity k2 of the region #2 is less than the thermal conductivity k1 of the region #1.

For example, in this application, the thermal conductivity k2 of the region #2 may be less than the thermal conductivity k1 of the region #1 by selecting a material.

The following describes parameters in the region #3 in detail.

a. Size of Region #3

A boundary of the region #3 may be located on the inner side of the boundary of the acoustic isolation layer. In other words, a projection of the region #3 on the plane #A is located inside the projection of the acoustic isolation layer on the plane #A.

b. Width of Region #3

As an example but not a limitation, a width d3 of an edge of an outer ring and an edge of an inner ring of the region #3 (or a loop width of a projection of the region #3 on the plane #A, or a thickness of the region #3) is greater than or equal to 0.1 μm and less than or equal to 2 μm.

It should be understood that the foregoing enumerated values of the width d3 of the region #3 are merely examples for description. This is not particularly limited in this application. A width d3 of the region #3 may be randomly adjusted based on parameters such as a range of the region #1, a range of the region #2, a range of the region #4, and a range of the acoustic isolation layer.

c. Height of Region #3

A height of the region #3 (specifically, a height in the z-axis direction) may be greater than or equal to 0.05 micrometers (μm), and may be less than or equal to 0.6 μm.

For example, as shown in FIG. 10, a height of the region #3 is the same as the height of the region #1 and/or the height of the region #2.

Figure 12:
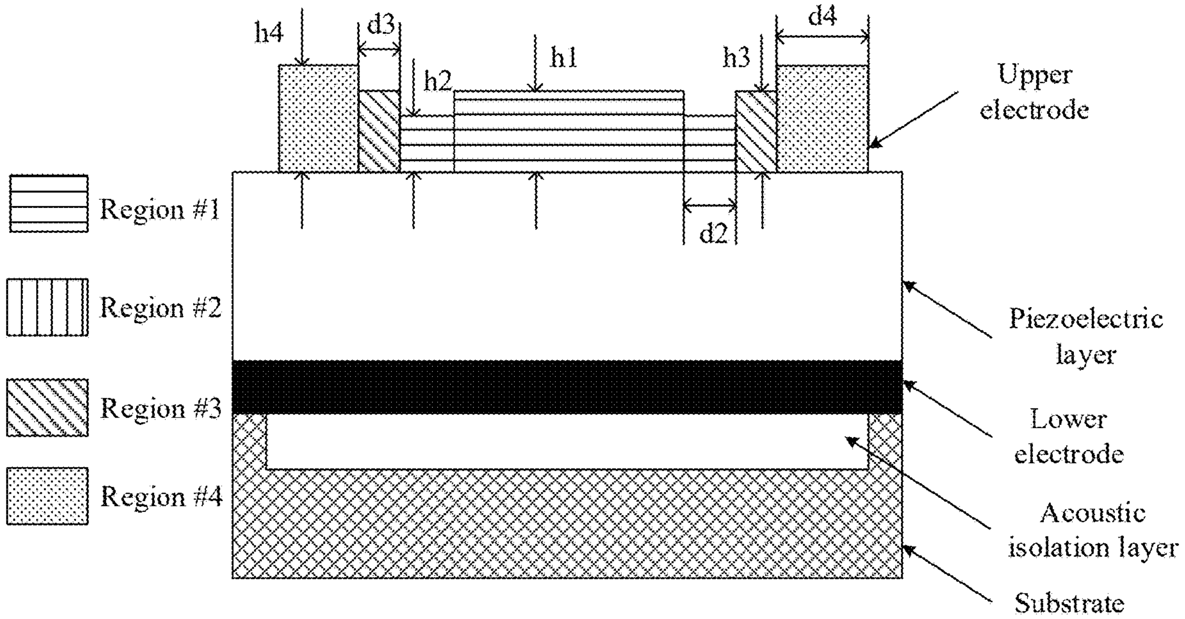
FIG. 12 is a front sectional view of another example of an acoustic wave resonator according to this application.

Alternatively, the height h3 of the region #3 may be different from the height h2 of the region #2. For example, as shown in FIG. 12, h3 is greater than h2.

In addition, a relationship between the height of the region #3 and the height of the region #1 is not particularly limited in this application.

For example, h1=h2=h3.

For another example, h3=h1>h2.

d. Material of Region #3

The region #3 is made of a conductive material. For example, a material of the region #3 is molybdenum, titanium, platinum, aluminum, copper, gold, or the like.

It should be understood that the foregoing listed materials of the region #3 are merely examples for description, and this application is not limited thereto.

As an example but not a limitation, materials of the region #3 and the region #1 may be the same.

e. Density of Region #3 (Specifically, a Relationship Between a Density of the Region #3 and the Density of the Region #1 and the Density of the Region #2)

As an example but not a limitation, in this application, a density ρ3 of the region #3 is greater than the density ρ2 of the region #2. The density ρ3 of the region #3 is equal to the density ρ1 of the region #1.

That is, ρ3=ρ1>ρ2.

In this application, the foregoing density relationships may be implemented by selecting a material.

f. Thermal Conductivity of Region #3 (Specifically, a Relationship Between a Thermal Conductivity of the Region #3 and the Thermal Conductivity of the Region #1 and/or the Thermal Conductivity of the Region #2)

In this application, a thermal conductivity k3 of the region #3 is equal to the thermal conductivity k1 of the region #1.

In addition, in this application, a relationship between the thermal conductivity k3 of the region #3 and the thermal conductivity k2 of the region #2 is not particularly limited.

The following describes parameters in the region #4 in detail.

I. Size of Region #4

A boundary of the region #4 may be located on the inner side of the boundary of the acoustic isolation layer. In other words, a projection of the region #4 on the plane #A is located inside the projection of the acoustic isolation layer on the plane #A.

II. Width of Region #4

As an example but not a limitation, a width d4 of an edge of an outer ring and an edge of an inner ring of the region #4 (or a loop width of a projection of the region #4 on the plane #A, or a thickness of the region #4) is greater than or equal to 0.5 μm and less than or equal to 10 μm.

It should be understood that the foregoing enumerated values of the width d4 of the region #4 are merely examples for description. This is not particularly limited in this application. A width d4 of the region #4 may be randomly adjusted based on parameters such as a range of the region #1, a range of the region #2, a range of the region #3, and a range of the acoustic isolation layer.

III. Height of Region #4

A height of the region #4 (specifically, a height in the z-axis direction) may be greater than or equal to 0.05 micrometers (μm), and may be less than or equal to 0.6 μm.

For example, as shown in FIG. 10, the height of the region #4 is the same as the height of the region #1, the height of the region #2, and/or the height of the region #3.

Alternatively, the height h4 of the region #4 may be different from the height h2 of the region #2. For example, as shown in FIG. 12, h4 is greater than h2. In addition, the height h4 of the region #4 may be different from the height h1 of the region #1. For example, as shown in FIG. 12, h4 is greater than h1.

For example, h1=h2=h3=h4.

For another example, h4>h3=h1>h2.

IV. Material of Region #4

The region #4 is made of a conductive material. For example, a material of the region #4 is molybdenum, titanium, platinum, aluminum, copper, gold, or the like.

It should be understood that the foregoing listed materials of the region #4 are merely examples for description, and this application is not limited thereto.

V. Density of Region #4 (Specifically, a Relationship Between a Density of the Region #4 and the Density of the Region #1, the Density of the Region #2, and the Density of the Region #3)

As an example but not a limitation, in this application, a density ρ4 of the region #4 is greater than the density ρ2 of the region #2. The density ρ4 of the region #4 is greater than the density ρ1 of the region #1.

That is, ρ4>ρ3=ρ1>ρ2.

In this application, the foregoing density relationships may be implemented by selecting a material. Therefore, an acoustic reflection boundary condition is formed, and a parasitic mode of the resonator is suppressed.

VI. Thermal Conductivity of Region #4 (Specifically, a Relationship Between a Thermal Conductivity of the Region #4 and the Thermal Conductivity of the Region #1)

In this application, a thermal conductivity k4 of the region #4 is less than the thermal conductivity k1 of the region #1.

In addition, in this application, a relationship between the thermal conductivity k4 of the region #4 and the thermal conductivity k2 of the region #2 is not particularly limited.

The following describes a method for preparing the acoustic wave resonator.

(a) A sacrificial layer material is deposited on a silicon substrate, where the sacrificial layer material may be a dielectric material such as silicon dioxide or phosphorosilicate glass. A pattern of the sacrificial layer material is manufactured into a pattern of a predetermined acoustic isolation layer by photoetching and etching processes to form a sacrificial layer of the acoustic isolation layer.

(b) Silicon or germanium is epitaxially extended on a surface of the silicon substrate on which no sacrificial layer material is disposed by using an epitaxial process, an epitaxial height is greater than or equal to a height of the sacrificial layer, and the sacrificial layer and the substrate are processed into a flat surface by using a chemical mechanical polishing process, to facilitate subsequent electrode and piezoelectric layer deposition and patterning processes.

(c) A lower electrode material above the sacrificial layer and the substrate is deposited by using a physical vapor deposition process or another process, where the lower electrode material may be a metal material such as molybdenum, platinum, tungsten, or aluminum, and a lower electrode is formed by using photoetching and etching processes.

(d) A piezoelectric layer is deposited above the lower electrode by using the physical vapor deposition process.

(e) An electrode material of the region #1 is deposited above the piezoelectric layer by using the physical vapor deposition process, and an electrode of the region #1 is formed by using the photoetching and etching processes.

(f) An electrode material of the region #2 is deposited above the piezoelectric layer by using the physical vapor deposition process, and an electrode of the region #2 is formed by using the photoetching and etching processes.

(g) An electrode material of the region #3 is deposited above the piezoelectric layer by using the physical vapor deposition process, and an electrode of the region #3 is formed by using the photoetching and etching processes.

(h) An electrode material of the region #4 is deposited above the piezoelectric layer by using the physical vapor deposition process, and an electrode of the region #4 is formed by using the photoetching and etching processes.

(i) The sacrificial layer material is removed by using a corrosion solution or gas to form an acoustic isolation layer.

Figure 13:
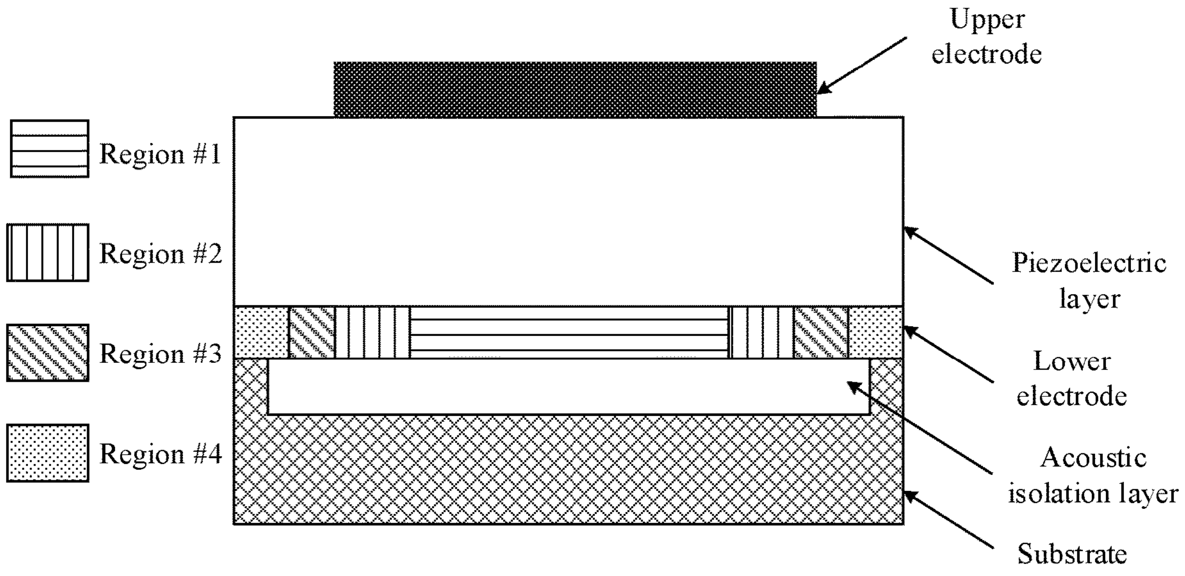
FIG. 13 is a front sectional view of still another example of an acoustic wave resonator according to this application.

FIG. 13 is a front sectional view of still another example of an acoustic wave resonator according to this application. A difference from the acoustic wave resonator shown in FIG. 10 lies in that the lower electrode of the acoustic wave resonator shown in FIG. 13 includes four regions, and parameters of the four regions are similar to parameters of four regions of the upper electrode of the acoustic wave resonator shown in FIG. 10. To avoid repetition, detailed description is omitted herein.

In addition, to improve performance of the piezoelectric layer, in the acoustic wave resonator shown in FIG. 13, heights (specifically, heights in the z-axis direction) of the four regions of the lower electrode are the same, and flatness of upper surfaces (that is, surfaces in contact with the piezoelectric layer) of the four regions of the lower electrode is the same.

Figure 14:
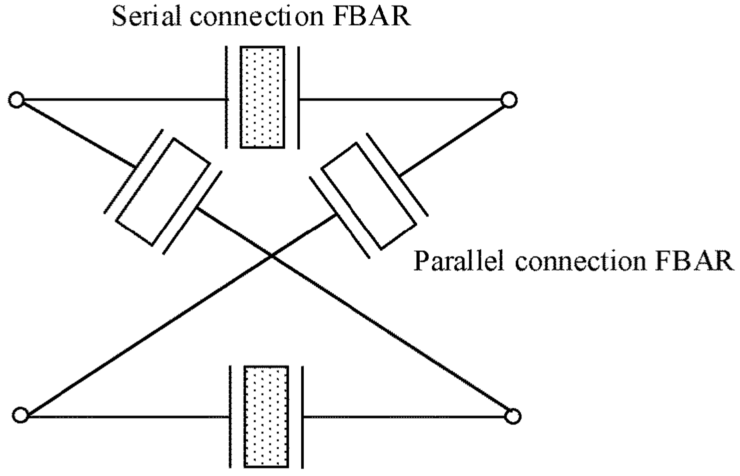
FIG. 14 is a schematic diagram of an example of a filter according to this application.

FIG. 14 is a schematic diagram of an example of a filter according to this application. As shown in FIG. 14, the filter includes a plurality of acoustic wave resonators, and at least one resonator in the plurality of acoustic wave resonators has a structure of the acoustic wave resonator shown in any one of FIG. 2 to FIG. 13. To avoid repetition, detailed description thereof is omitted herein. In addition, structures of two acoustic wave resonators connected in parallel may be the same or may be different. This is not specifically limited in this application. In addition, a grid filter may be formed according to a connection manner of the acoustic wave resonator shown in FIG. 14.

Figure 15:
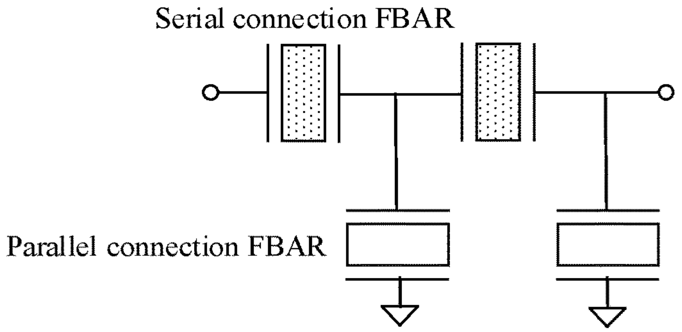
FIG. 15 is a schematic diagram of another example of a filter according to this application.

FIG. 15 is a schematic diagram of another example of a filter according to this application. As shown in FIG. 15, the filter includes a plurality of acoustic wave resonators, and at least one resonator in the plurality of acoustic wave resonators has a structure of the acoustic wave resonator shown in any one of FIG. 2 to FIG. 13. To avoid repetition, detailed description thereof is omitted herein. In addition, structures of two acoustic wave resonators connected in parallel may be the same or may be different. This is not specifically limited in this application. In addition, a stepped filter may be formed according to a connection manner of the acoustic wave resonator shown in FIG. 15.

Figure 16:
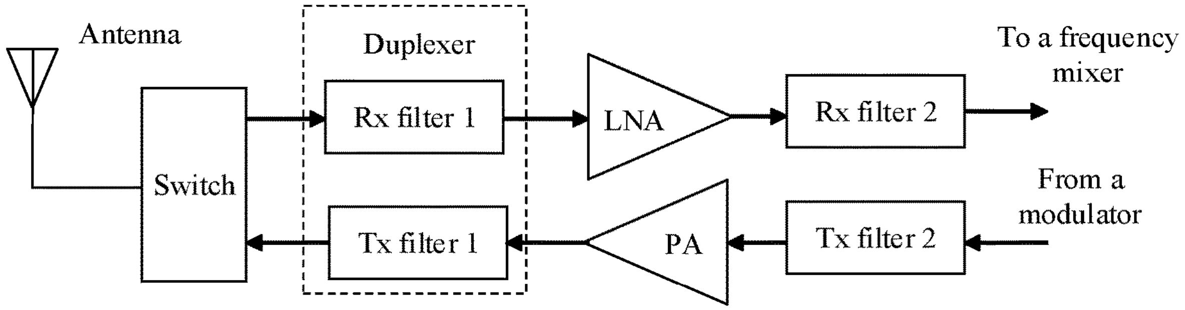
FIG. 16 is a schematic diagram of a radio frequency module of a wireless communications device according to this application.

FIG. 16 is a diagram of a structure of a wireless communications device (specifically, a radio frequency front-end of the wireless communications device) according to this application. As shown in FIG. 16, the communications device includes two communications links: a receive (Rx) communications link and a transmit (Tx) communications link. On one hand, an antenna receives a weak Rx signal, and an Rx filter #1, for example, a band-pass filter (Band Pass Filter, BPF) selects the weak Rx signal from a wide electromagnetic wave spectrum, and amplifies the weak Rx signal by using a low noise amplifier (LNA). Then the weak signal passes through an Rx filter #2, for example, a BPF, and the weak signal is transmitted to a frequency mixer. On the other hand, a Tx signal transmitted from a modulator first passes through a Tx filter #2, for example, a BPF, to filter out a spectrum other than the Tx signal. Then the Tx signal passes through a power amplifier (PA) at which a to-be-transmitted Tx signal is amplified, the Tx signal passes through a Tx filter #1, for example, a BPF, and the Tx signal is transmitted through a same antenna.

At least one of the Rx filter #1, the Rx filter #2, the Tx filter #1, and the Tx filter #2 has a structure of the acoustic wave resonator shown in any one of the foregoing accompanying drawings FIG. 2 to FIG. 13. To avoid repetition, detailed description thereof is omitted herein.

Figure 17:
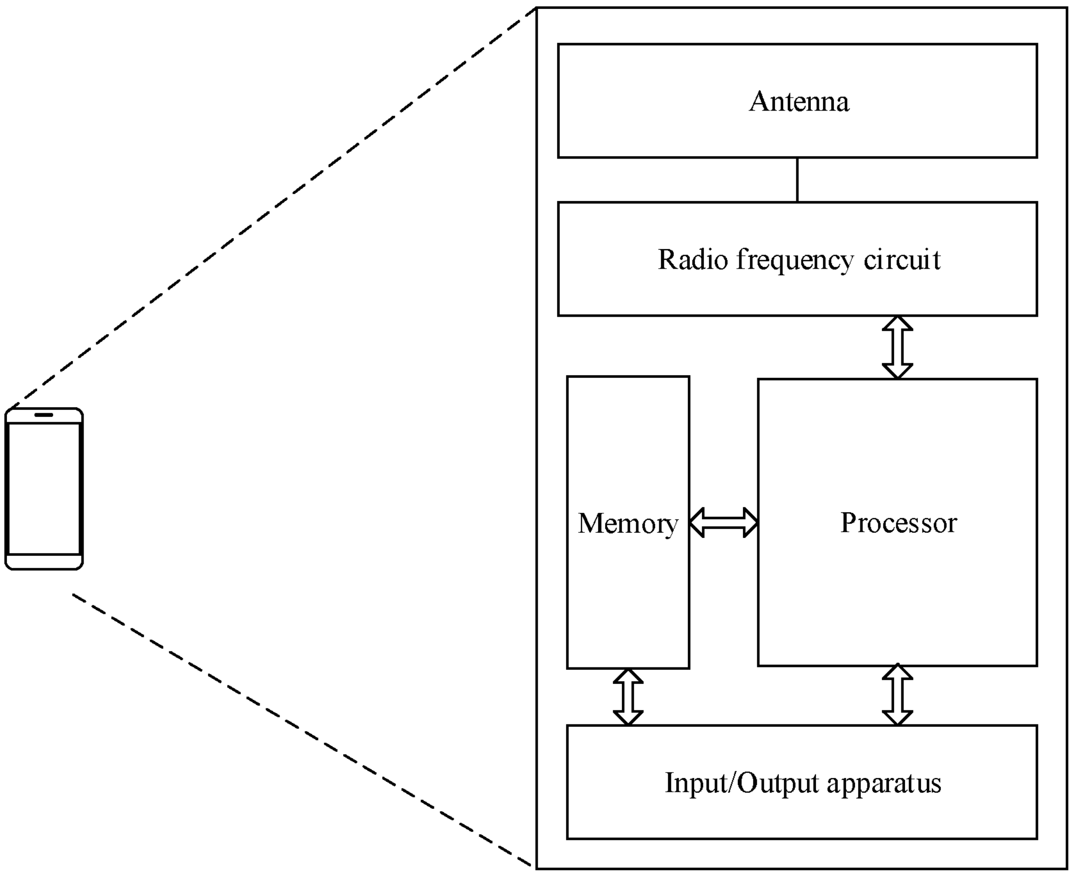
FIG. 17 is a schematic diagram of a terminal device according to this application.

FIG. 17 is a simplified schematic diagram of a structure of a terminal device. For ease of understanding and illustration, an example in which the terminal device is a mobile phone is used in FIG. 17. As shown in FIG. 17, the terminal device includes a processor, a memory, a radio frequency circuit, an antenna, and an input/output apparatus. The processor is mainly configured to: process a communications protocol and communications data, control the terminal device, execute a software program, process data of the software program, and the like. The memory is mainly configured to store the software program and the data. The radio frequency circuit is mainly configured to: perform conversion between a baseband signal and a radio frequency signal, and process the radio frequency signal. The antenna is mainly configured to receive and send the radio frequency signal in a form of an electromagnetic wave. The input/output apparatus such as a touchscreen, a display screen, or a keyboard is mainly configured to receive data input by a user and output data to the user. It should be noted that some types of terminal devices may not have the input/output apparatus. In this application, the radio frequency circuit may include a plurality of filters, and at least one of the plurality of filters has a structure of the acoustic wave resonator shown in any one of FIG. 2 to FIG. 13.

When data needs to be sent, the processor performs baseband processing on to-be-sent data, and outputs a baseband signal to the radio frequency circuit. After performing radio frequency processing on the baseband signal, the radio frequency circuit sends the radio frequency signal in an electromagnetic wave form by using the antenna. When data is sent to the terminal device, the radio frequency circuit receives the radio frequency signal by using the antenna, converts the radio frequency signal into the baseband signal, and outputs the baseband signal to the processor. The processor converts the baseband signal into data and processes the data. For ease of description, FIG. 17 shows only one memory and one processor. In an actual terminal device product, there may be one or more processors and one or more memories. The memory may also be referred to as a storage medium, a storage device, or the like. The memory may be disposed independently of the processor, or may be integrated with the processor. This is not limited in this embodiment of this application.

In this embodiment of this application, the antenna and the radio frequency circuit that have receiving and sending functions may be considered as a transceiver unit of the terminal device, and the processor that has a processing function may be considered as a processing unit of the terminal device.

Figure 18:
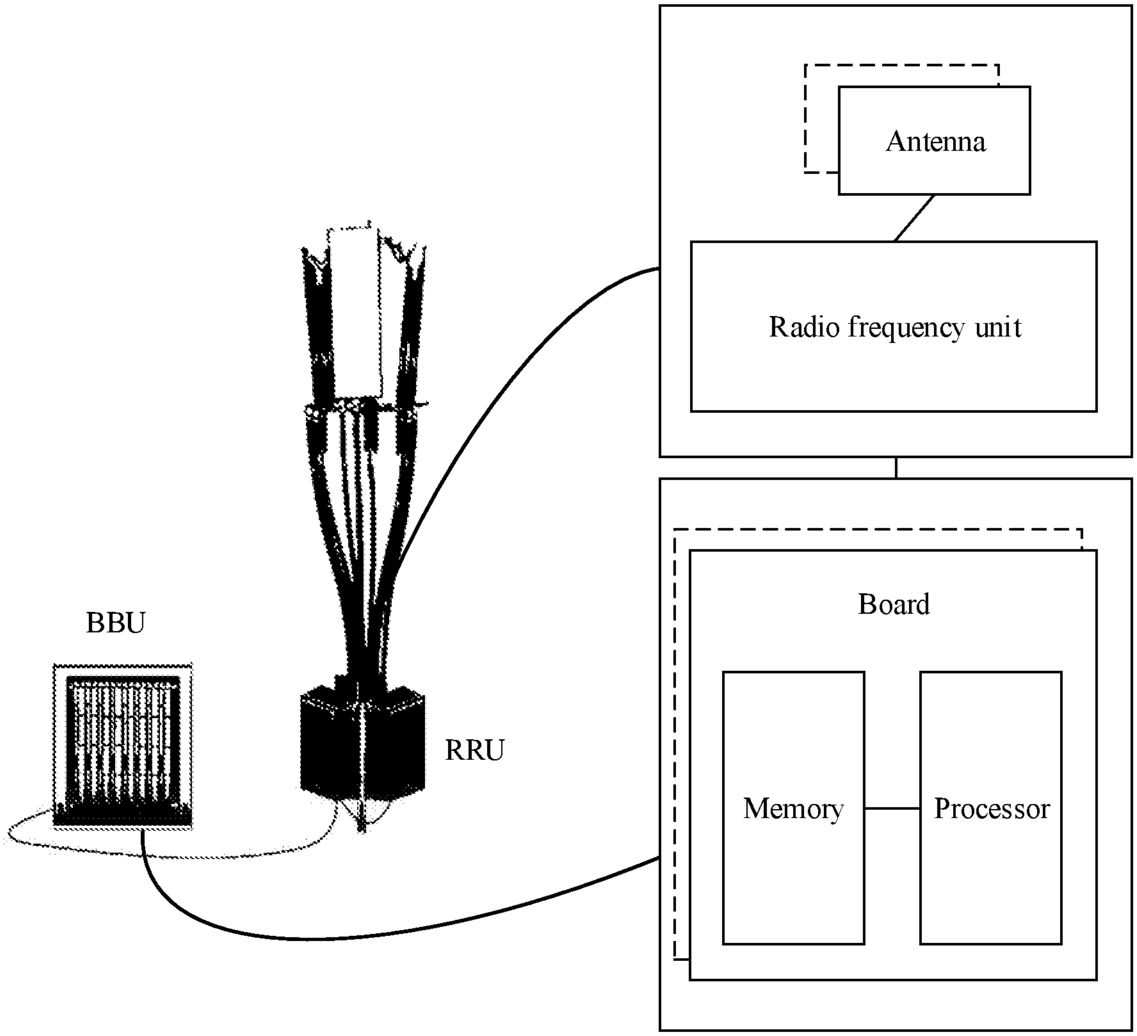
FIG. 18 is a schematic diagram of a base station according to this application.

FIG. 18 is a simplified schematic diagram of a structure of a base station. The base station includes a transceiver and a processor. The transceiver is mainly configured to receive and send a radio frequency signal and perform conversion between the radio frequency signal and a baseband signal. A processor part is mainly configured to perform baseband processing, control the base station, and the like. The transceiver may be usually referred to as a transceiver unit, a transceiver, a transceiver circuit, or the like. The processor is usually a control center of the base station, and may be usually referred to as a processing unit.

The transceiver includes an antenna and a radio frequency circuit. The radio frequency circuit is mainly configured to perform radio frequency processing. Optionally, a component configured to implement a receiving function in the transceiver may be considered as a receiving unit, and a component configured to implement a sending function may be considered as a sending unit. In other words, the transceiver includes the receiving unit and the sending unit. The receiving unit may also be referred to as a receiver machine, a receiver, a receiver circuit, or the like, and the sending unit may be referred to as a transmitter, a transmitter circuit, or the like.

The processor may include one or more boards, and each board may include one or more processors and one or more memories. The processor is configured to read and execute program in the memory to implement a baseband processing function and control the base station. If there are a plurality of boards, the boards may be interconnected to enhance a processing capability. In an optional implementation, a plurality of boards may share one or more processors, a plurality of boards share one or more memories, or a plurality of boards simultaneously share one or more processors.

In this application, the transceiver (for example, a radio frequency circuit in the transceiver) may include a plurality of filters, and at least one of the plurality of filters has a structure of the acoustic wave resonator shown in any one of FIG. 2 to FIG. 13.

A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

In several embodiments provided in this application, it should be understood that the disclosed system and apparatus may be implemented in other manners. For example, the described apparatus embodiment is merely an example. For example, division into the units is merely logical function division and may be other division in an actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in an electrical form, a mechanical form, or another form.

The units described as separate parts may or may not be physically separate, and parts displayed as units may or may not be physical units, may be located in one position, or may be distributed on a plurality of network units. Some or all of the units may be selected based on an actual requirement to achieve the objectives of the solutions of embodiments.

In addition, functional units in embodiments of this application may be integrated into one processing unit, each of the units may exist alone physically, or two or more units may be integrated into one unit.

The foregoing description is merely specific implementation of this application, but is not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An acoustic wave resonator comprising:

a first electrode;

a second electrode; and a piezoelectric layer made of a piezoelectric material and disposed between the first electrode and the second electrode, wherein the first electrode comprises:

a first region made of a first material having a first density;

a second region formed as a loop region surrounding the first region and electrically connected to the first region, wherein the second region is made of a second material having a second density different from the first density; and a third region formed as a loop region surrounding the second region and electrically connected to the second region, wherein the third region is made of a third material having a third density;

wherein the first region, the second region, and the third region are arranged such that their respective bottom surfaces lie in a common plane;

the third density of the third material is greater than or equal to the first density of the first material, and the first density of the first material is greater than the second density of the second material; and a first height of the first region, a second height of the second region and a third height of the third region in a first direction perpendicular to the common plane are relative to densities of the first region, the second region and the third region, such that the third height of the third region is greater than or equal to the first height of the first region, and the first height of the first region is greater than the second height of the second region.

2. The acoustic wave resonator according to claim 1, wherein a height difference between the first region and the second region in the first direction is greater than or equal to 5 nanometers and less than or equal to 100 nanometers.

3. The acoustic wave resonator according to claim 1, wherein a width between an outer edge and an inner edge of the second region is greater than or equal to 0.5 micrometers and less than or equal to 10 micrometers.

4. The acoustic wave resonator according to claim 1, wherein the first material of the first region has a first thermal conductivity, the second material of the second region has a second thermal conductivity, and the first thermal conductivity is greater than the second thermal conductivity.

5. The acoustic wave resonator according to claim 1, wherein a width between an outer edge and an inner edge of the third region is greater than or equal to 0.5 micrometers and less than or equal to 10 micrometers.

6. The acoustic wave resonator according to claim 1, wherein the first density is less than the third density, and the first height is less than the third height.

7. The acoustic wave resonator according to claim 1, wherein the material of the third region has a third thermal conductivity less than a first thermal conductivity of the first region.

8. The acoustic wave resonator according to claim 1, wherein the first electrode further comprises:

a fourth region formed as a loop region surrounding the third region and electrically connected to the third region, wherein the fourth region is made of a fourth material having a fourth density greater than the third density, a bottom surface of the fourth region lies in the common plane, and a fourth height of the fourth region in the first direction perpendicular to the common plane is greater than the third height of the third region.

9. A filter comprising:

an acoustic wave resonator comprising:

a first electrode;

a second electrode; and a piezoelectric layer made of a piezoelectric material and disposed between the first electrode and the second electrode, wherein the first electrode comprises:

a first region made of a first material having a first density;

a second region formed as a loop region surrounding the first region and electrically connected to the first region, wherein the second region is made of a second material having a second density different from the first density; and a third region formed as a loop region surrounding the second region and electrically connected to the second region, wherein the third region is made of a third material having a third density;

wherein the first region, the second region, and the third region are arranged such that their respective bottom surfaces lie in a common plane;

the third density of the third material is greater than or equal to the first density of the first material, and the first density of the first material is greater than the second density of the second material; and a first height of the first region, a second height of the second region and a third height of the third region in a first direction perpendicular to the common plane are relative to densities of the first region, the second region and the third region, such that the third height of the third region is greater than or equal to the first height of the first region, and the first height of the first region is greater than the second height of the second region.

10. The filter according to claim 9, wherein the first material of the first region has a first thermal conductivity, the second material of the second region has a second thermal conductivity less than the first thermal conductivity.

11. A terminal device comprising:

a transceiver configured to receive or send a signal, wherein the transceiver comprises a filter configured to filter the signal; and a processor configured to perform signal processing on the signal, wherein the filter comprises:

an acoustic wave resonator comprising:

a first electrode;

a second electrode; and a piezoelectric layer made of a piezoelectric material and disposed between the first electrode and the second electrode, wherein the first electrode comprises:

a first region made of a first material having a first density;

a second region formed as a loop region surrounding the first region and electrically connected to the first region, wherein the second region is made of a second material having a second density different from the first density; and a third region formed as a loop region surrounding the second region and electrically connected to the second region, wherein the third region is made of a third material having a third density;

wherein the first region, the second region, and the third region are arranged such that their respective bottom surfaces lie in a common plane;

the third density of the third material is greater than or equal to the first density of the first material, and the first density of the first material is greater than the second density of the second material; and a first height of the first region, a second height of the second region and a third height of the third region in a first direction perpendicular to the common plane are relative to densities of the first region, the second region and the third region, such that the third height of the third region is greater than or equal to the first height of the first region, and the first height of the first region is greater than the second height of the second region.

12. The filter according to claim 9, wherein the first electrode further comprises:

a fourth region formed as a loop region surrounding the third region and electrically connected to the third region, wherein the fourth region is made of a fourth material having a fourth density greater than the third density, a bottom surface of the fourth region lies in the common plane, and a fourth height of the fourth region in the first direction perpendicular to the common plane is greater than the third height of the third region.

13. The terminal device according to claim 11, wherein the first electrode further comprises:

a fourth region formed as a loop region surrounding the third region and electrically connected to the third region, wherein the fourth region is made of a fourth material having a fourth density greater than the third density, a bottom surface of the fourth region lies in the common plane, and a fourth height of the fourth region in the first direction perpendicular to the common plane is greater than the third height of the third region.

* * * * *